US012750013B2

(12) United States Patent

Laraway et al.

(10) Patent No.: US 12,750,013 B2
(45) Date of Patent: Sep. 29, 2026

(54) APPARATUS AND METHOD FOR DIGITAL PREDISTORTION INITIALIZATION OF HIGH-POWER AMPLIFIERS

(71) Applicant: L3Harris Technologies, Inc., Melbourne, FL (US)

(72) Inventors: Stephen A. Laraway, Kaysville, UT (US); Brent J. Berry, Mountain Green, UT (US)

(73) Assignee: L3Harris Technologies, Inc., Melbourne, FL (US)

( * ) Notice: Subject to any disclaimer, the term of this patent is extended or adjusted under 35 U.S.C. 154(b) by 508 days.

(21) Appl. No.: 18/238,011

(22) Filed: Aug. 25, 2023

(65) Prior Publication Data

US 2025/0070725 A1 Feb. 27, 2025

(51) Int. Cl.

| | |
|---|---|
| ***H03F 1/32*** | (2006.01) |
| ***H03F 3/195*** | (2006.01) |
| ***H03F 3/24*** | (2006.01) |
| ***H04B 1/04*** | (2006.01) |

(52) U.S. Cl.

CPC ......... *H03F 1/3258* (2013.01); *H03F 1/3247* (2013.01); *H03F 3/195* (2013.01); *H03F 3/24* (2013.01); *H04B 1/0475* (2013.01); *H03F 2200/451* (2013.01); *H03F 2201/3224* (2013.01); *H03F 2201/3233* (2013.01); *H04B 2001/0425* (2013.01)

(58) Field of Classification Search

CPC .. H03F 1/3258; H03F 3/24; H03F 2201/3224; H03F 2201/3233; H03F 2200/451; H03F 3/195; H03F 1/3247; H04B 1/0475; H04B 2001/0425

USPC ........................................................ 330/149

See application file for complete search history.

(56) References Cited

U.S. PATENT DOCUMENTS

| | | | | |
|---|---|---|---|---|
| 10,396,723 | B1 * | 8/2019 | Haas | H03F 1/3258 |
| 12,456,995 | B2 * | 10/2025 | Tanzil | H03F 1/3241 |
| 2005/0231402 | A1 * | 10/2005 | Seitner | H04K 1/04 341/110 |

(Continued)

FOREIGN PATENT DOCUMENTS

| | | | | |
|---|---|---|---|---|
| CN | 115766355 A * | 3/2023 | | |
| EP | 4140398 A1 * | 3/2023 | | A61B 5/7228 |

OTHER PUBLICATIONS

Ku, Closed-form Expression of IMD Considering Input/Output Frequency Responses in Nonlinear RF Power Amplifiers for Digital Predistortion, Dec. 2006, 2006 Asia-Pacific Microwave Conference (Year: 2006).*

(Continued)

*Primary Examiner* — Andrea Lindgren Baltzell
*Assistant Examiner* — Lance Torbjorn Bartol
(74) *Attorney, Agent, or Firm* — Fox Rothschild LLP; Carol E. Thorstad-Forsyth

(57) ABSTRACT

An apparatus and method are provided for digital predistortion of an electrical signal to pre-compensate for nonlinear distortions in a nonlinear channel (e.g., a nonlinear channel including a high-power amplifier). The digital predistortion processor includes a nonlinear filter. Filter coefficients are determined using a modified input electrical signal having multiple simultaneous tones, using an iterative process which adapts the modified input electrical signal to reduce levels of intermodulation distortions in a modified output electrical signal.

20 Claims, 16 Drawing Sheets

(56) References Cited

U.S. PATENT DOCUMENTS

| | | | | |
|---|---|---|---|---|
| 2014/0313071 | A1* | 10/2014 | Mccorkle | G01S 13/106<br>342/202 |
| 2014/0314182 | A1* | 10/2014 | Azadet | H04L 27/367<br>375/297 |
| 2016/0359552 | A1* | 12/2016 | Monsen | H04B 7/0639 |
| 2018/0159567 | A1* | 6/2018 | Matsuura | H03F 3/24 |
| 2020/0186103 | A1* | 6/2020 | Weber | H04L 27/368 |
| 2023/0231524 | A1* | 7/2023 | Kean | H03F 3/24<br>330/291 |

OTHER PUBLICATIONS

Cavers et al., "Amplifier linearization using a digital predistorter with fast adaptation and low memory requirements", IEEE Trans. Veh. Technol., vol. 39, pp. 374-382, Nov. 1990.

Ding et al., "A robust predistorter constructed using memory polynomials," IEEE Trans. Veh. Technol., vol. 53, pp. 156-162, Jan. 2004.

Faulkner et al., "Adaptive linearization using predistortion-experimental results", IEEE Trans. Veh. Technol., vol. 43, pp. 323-332, May 1994.

Franco M., "Bias induced memory effects in RF power amplifiers," Linearizer Technology Inc, Oct. 9, 2006, p. 38.

J. Wood, "Behavioral Modeling and Linearization of RF Power Amplifiers", 2014.

Lashkarian et al., "FPGA Implementation of Digital Predistortion Linearizers for Wideband Power Amplifiers", Proceeding of the SDR 04 Technical Conference and Product Exposition, 2004, 6 Pages.

Morgan et al., "A Generalized Memory Polynomial Model for Digital Predistortion of RF Power Amplifiers", IEEE Transactions on Signal Processing, vol. 54, No. 10, Oct. 2006, pp. 3852-3860.

Pratt et al., "Ultrawideband Digital Predistortion ( DPD ) : The Rewards ( Power and Performance ) and Challenges of Implementation in Cable Distribution Systems", Analog Dialogue, Jul. 2017.

Schoukens et al., "Identification of block-oriented nonlinear systems starting from linear approximations: A survey", Automatica, vol. 85, Nov. 2017, pp. 272-292.

Weiss et al., "Identification of nonlinear cascade systems using paired multisine signals", vol. 47, No. 1, pp. 332-336, Feb. 1998.

Xin et al., "Robust Digital Predistortion for LTE/5G Power Amplifiers Utilizing Negative Feedback Iteration", ZTE Communications, Sep. 2020 vol. 18 No. 3, pp. 49-56.

Zhu et al., "An adaptive Volterra predistorter for the linearization of RF high power amplifiers," 2002 IEEE MTT-S International Microwave Symposium Digest (Cat. No.02CH37278), Jun. 2002, pp. 461-464.

* cited by examiner

APPARATUS AND METHOD FOR DIGITAL PREDISTORTION INITIALIZATION OF HIGH-POWER AMPLIFIERS

BACKGROUND

High-power amplifiers (HPAs) may exhibit a nonlinear response (e.g., due to saturation). As the input power to the HPA increases, the HPA moves from a linear region of operation and into saturation region. In the saturation region, the output signal from the HPA becomes compressed, exhibiting less and less gain as the input power to the HPA increases. This nonlinear response of the HPA distorts transmit signals, resulting in intermodulation distortion (IMD) and harmonic distortion that can degrade the performance of a radio frequency (RF) transmitter, for example. Accordingly, when HPAs are operated in their nonlinear region, their output becomes distorted. The distortion can affect the in-band performance and may also result in interference in adjacent channels.

Although digital predistortion (DPD) may be used to pre-compensate for the nonlinear response of the HPA, there are several challenges to determine/initialize the filter coefficients of the DPD. These challenges are further compounded for wideband applications and applications with strong nonlinearities. For example, the filter coefficients are often not linearly applied to compensate for distortion. When using previous approaches the filter coefficients cannot be solved for using a linear method such as a least-squares. Additionally, when using previous approaches, the initialization of the DPD tends not to be robust to a wide variety of different waveforms with different characteristics and to a wide range of frequencies and bandwidths. Further, previous approaches tend to fail for strong nonlinearities.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

One embodiment illustrated herein is a given apparatus or method provided for digital predistortion of an electrical signal to pre-compensate for nonlinear distortions in a nonlinear channel (e.g., a nonlinear channel including a high-power amplifier). The digital predistortion processor includes a nonlinear filter. Filter coefficients are determined using a modified input electrical signal having multiple simultaneous tones, using an iterative process which adapts the modified input electrical signal to reduce levels of intermodulation distortions in a modified output electrical signal. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Figure 1:
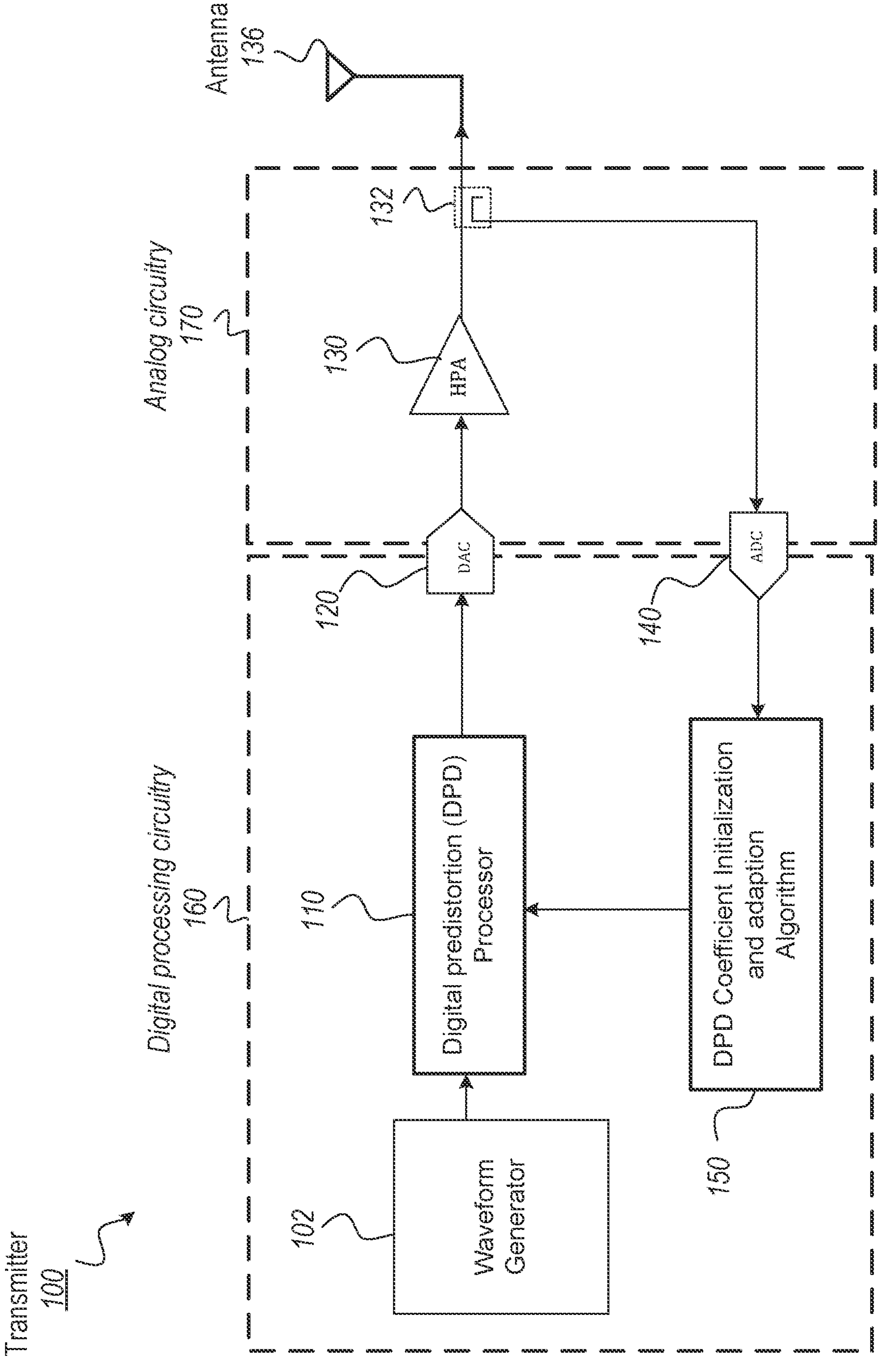
FIG. 1 illustrates a block diagram of a transmitter, according to one embodiment.

Previous methods of determining the DPD coefficients were not capable of correcting for strong RF distortions (linear and nonlinear) across wide bandwidths while being waveform agnostic. Some embodiments described herein address these challenges.

As discussed above, previous approaches to initializing digital predistortion (DPD) processors suffer from various challenges, especially for wideband applications and high-power amplifiers (HPA) with strong nonlinearities.

Nonlinear Signal distortions are due to linear and nonlinear effects of an RF chain, including a high-power amplifier (HPA). The output power versus input power of the HPA can be (and usually is) a nonlinear function. In a memoryless HPA the output power is a function of the input power at the current time. Memoryless nonlinearities can be described by an AM/AM curve and AM/PM curve. In an HPA that has memory, the HPA gain depends on the input signal at the current time and at times in the past. In addition to nonlinear distortion with memory effects, an HPA may have significant linear distortions before and after the nonlinearity.

Memory effects may result from energy storage in the system and are also a manifestation of the dynamical behavior of the system. As an example of how memory influences the output of a power, the rise and fall times of an amplifier may be different in the amplifier, resulting in a different output voltage for the same input voltage, depending on whether the current voltage is on a rising edge or a falling edge of the input signal. This phenomenon is known as hysteresis.

In previous DPD systems, the goal was typically limited to compensating for a single consistent signal type within a narrow bandwidth. Some embodiments described herein go farther, in that the DPD and initialization algorithms are capable of wide bandwidth operation while being waveform agnostic, which could include different modulations, different bandwidths, different carrier frequencies, and different number of signals. This signal environment presents several challenges not encountered when only compensating for a single consistent signal type within a narrow bandwidth. First, using adaptation alone to initially find the DPD coefficients has been used previously when compensating for a single consistent signal type within a narrow bandwidth. For the more demanding cases (e.g., multiple frequencies, wide bandwidths, multiple signals, and/or multiple modulations protocols), however, adaptation alone is insufficient to initially find the DPD coefficients. Second, in contrast to the previous DPD systems, the current DPD system can advantageously function properly for many signal types over the full system band.

Some embodiments described herein address the above-mentioned challenges using, e.g., a multi-step method in which the problem to be solved at each step is linear-in-parameters, and/or using a multi-tone sounding method that ensures robust corrections for a wide range of frequencies and wide variety of different waveforms, as well as being robust for strong nonlinearities.

Some embodiments described herein use DPD to pre-compensate for distortions arising from a linear and/or nonlinear channel (e.g., electrical components in a radio frequency (RF) and/or microwave transmitter). For example, high power amplifiers (HPAs) may have linear, and/or nonlinear memory effects particularly when operating near compression. These effects cause spectral distortions, namely intermodulation distortions (IMD) and harmonic distortions. These undesired artifacts may interfere with other users in the band. One approach to avoid these distortions in the transmitted output is to merely avoid the nonlinear regions of the HPA by reducing the signal input. But this has the unwanted consequence of decreasing the output power. Instead, the approach adopted here uses digital predistortion (DPD) to maintain a high output power with low IMD and harmonic levels.

Some embodiments described herein have the benefits of determining a DPD that is adapted to the linear, nonlinear, and memory characteristics of the entire RF chain, including the HPA and the other parts of the RF chain that are causing the linear, nonlinear, and memory effects. Further, some embodiments described herein are sufficiently robust to cover many waveform types, a wide bandwidth, and cover simultaneous signals for a system with significant distortions.

Referring now to FIG. 1, a transmitter 100 is shown (e.g., the transmitter 100 can be a radio frequency (RF), microwave, or millimeter wave transmitter). Within the digital processing circuitry 160, the transmitter 100 includes a waveform generator 102 that transmits a digital waveform to the DPD processor 110. Next, the signal is converted to analog by a digital-to-analog converter (DAC) 120, resulting in an analog signal, which demarks a transition from the digital processing circuitry 160 to the analog circuitry 170. The resultant analog signal is then amplified by the HPA 130. Note that this is a simplified representation, and that in practice there are often many analog and RF components that may add linear distortion to the signal. A portion of the output from the HPA 130 is sampled at the coupled port 132, and the sampled signal from the coupled port 132 is converted back to digital via an analog-to-digital converter (ADC) 140. The resultant digital signal is fed to processing circuitry 150 that performs a DPD coefficient initialization and adaption method to generate the coefficients used in DPD processor 110. The DPD processor 110 compensates for nonlinear and linear distortions resulting from the HPA 130 and other/accompanying circuitry in the transmission path to the antenna 136.

Figure 2A:
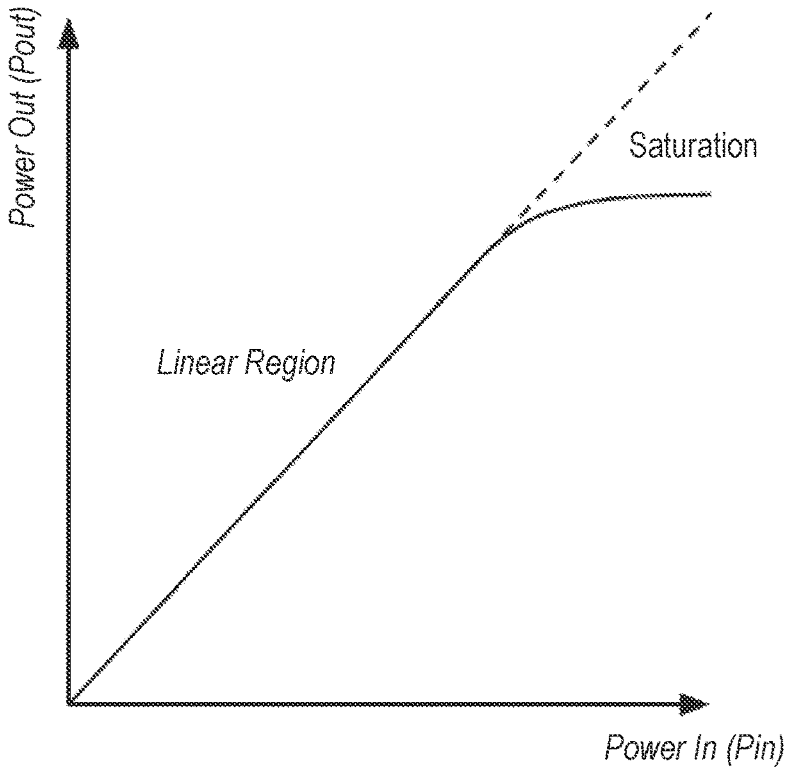
FIG. 2A illustrates a plot of a response curve for an amplifier, according to one embodiment.
Figure 2B:
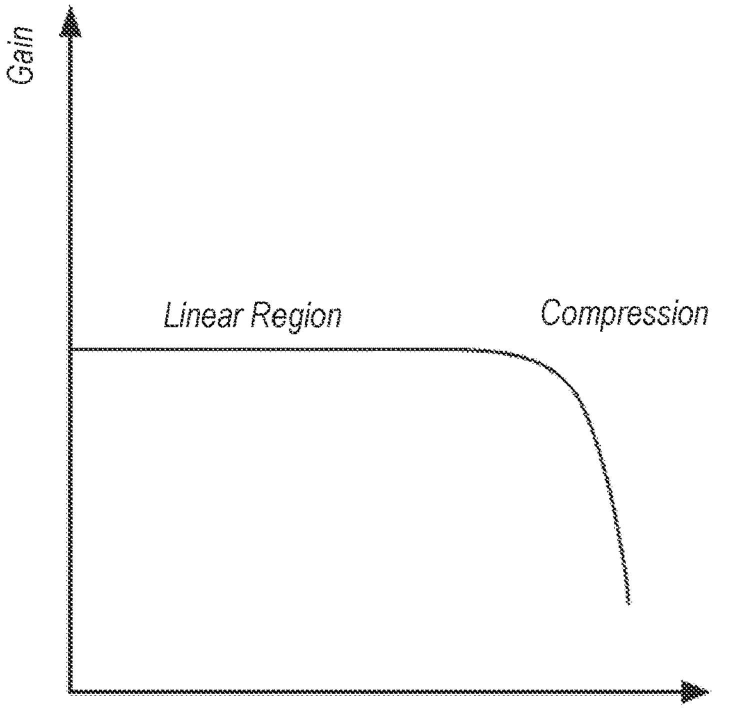
FIG. 2B illustrates a plot of a gain curve for an amplifier, according to one embodiment.

FIGS. 2A and 2B illustrate nonlinear distortions for a memoryless HPA model. In FIG. 2A, an example plot is provided showing the power out ($P_{out}$) of the HPA 130 as a function of the power in ($P_{in}$). In the linear region (e.g., for low $P_{in}$), the $P_{out}$ changes essentially linearly as a function of the $P_{in}$. But, for higher values of $P_{in}$, the $P_{out}$ rolls over, e.g., due to saturation of the HPA 130.

FIG. 2B illustrates an example plot of the gain as a function of the $P_{in}$. Here, the gain is constant throughout the linear region (e.g., for low $P_{in}$), and, as $P_{in}$ increases into the saturation region, the gain decreases, which decreases is referred to as compression. The power drive-up characteristic and gain response shown respectively in FIGS. 2A and 2B are common for an RF power amplifier at the fundamental frequency of operation. At low powers, the amplifier is in the linear region of operation. In practice, RF and microwave HPAs deviate from the ideal, and, even in a small-signal, linear regime, the amplifier is unlikely to be completely linear. This may be because the physical mechanisms governing charge control in the FET (field effect transistor) channel or the base of a BJT (bipolar junction transistor) are not themselves perfectly linear functions. Thus, even at low power, the HPA 130 will generate some low level of distortion.

At higher powers, the output power and gain deviate significantly from the linear relationship at small signal. This is the compression region of operation. At sufficiently high input drive, the $P_{out}$ flattens. At this point, the power has been saturated. In these regions of operation, the HPA 130 is very nonlinear. This compression behavior is also known as AM-to-AM conversion: by modulating (changing) the input signal amplitude, the amplitude of the output signal is modulated in a nonlinear fashion.

The onset of this 'strong' nonlinearity may be indicated by the 1-dB gain compression point (i.e., the output power at which the gain is one decibel below the small-signal value). When the HPA is at 1-dB compression, the output signal is already being distorted.

Some embodiments described herein use digital predistortion (DPD) before the HPA 130 to compensate for the nonlinear response of the HPA 130 and to reduce intermodulation distortion (IMD) and harmonic distortion. As discussed above, high power amplifiers (HPAs) are generally nonlinear devices when driven at higher input powers, especially for powers close to or exceeding the 1-dB gain compression point. This nonlinearity of the HPA 130 distorts transmit signals, causing IMD and harmonic distortion, which can degrade the performance of RF transmitters. Preferably, the DPD processor 110 applies an inverse nonlinear function to the transmit signal so that the output of the HPA 130 is an undistorted signal. As discussed above, FIG. 1 illustrates a schematic diagram for an example of a transmitter 100 using DPD. The DPD processor 110 is applied during digital processing (i.e., before the signal is converted from digital to analog via the digital-to-analog converter (DAC) 120), and a coupled port 132 samples data at the output of the HPA 130 that is used for initialization of the DPD coefficients.

Figure 3A:
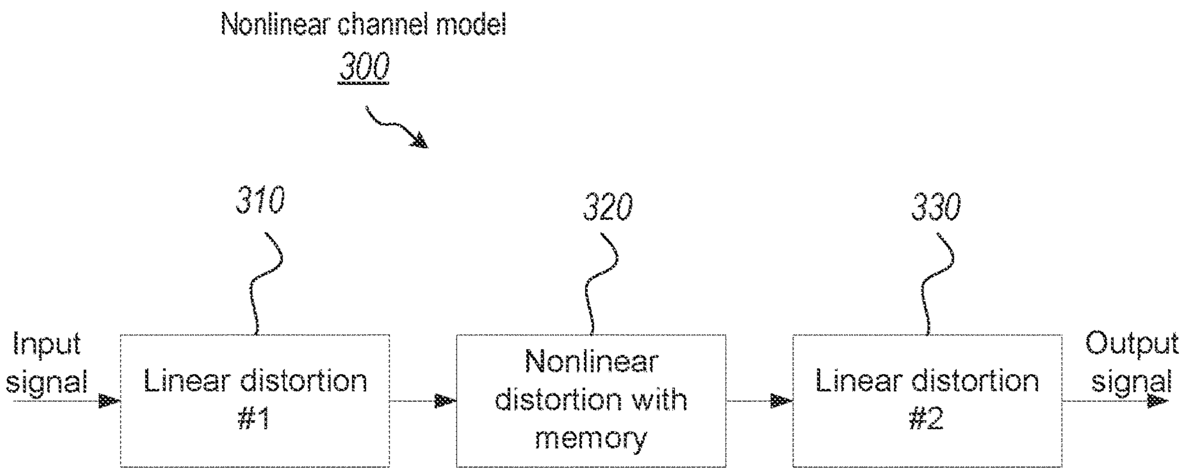
FIG. 3A illustrates a block diagram of a nonlinear channel, according to one embodiment.

FIG. 3A shows a block diagram of a nonlinear channel model 300 including three blocks. This nonlinear channel model 300 may be used for development of DPD architecture. According to the three-block model 300, the linear distortion blocks 310 and 330 represent linear amplitude and phase distortions, and the nonlinear distortion block 320 represents nonlinear amplitude and phase distortions including, e.g., distortions with memory effects.

Figure 3B:
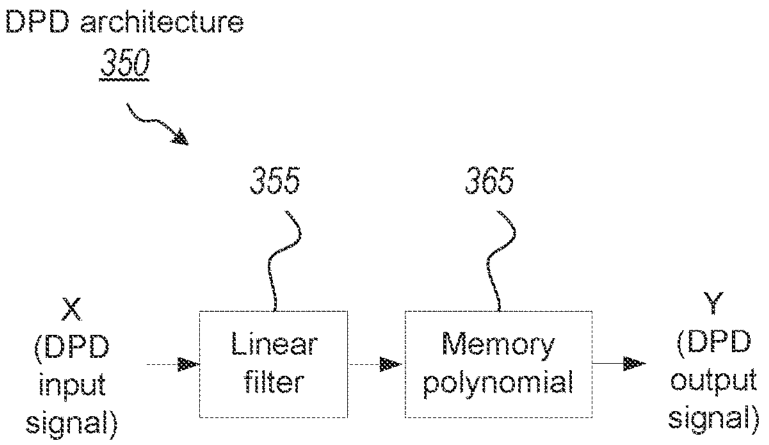
FIG. 3B illustrates a block diagram of a digital predistortion (DPD) architecture for a channel having nonlinear distortions with memory, according to one embodiment.

FIG. 3B shows a block diagram of a proposed DPD architecture 350, illustrating details of one embodiment of the DPD processor 110 illustrated in FIG. 1. The two main processing blocks are a linear filter 355 and a memory polynomial 365. The linear filter 355 and memory polynomial 365 may have complex coefficients. In some embodiments, interpolation is applied before the memory polynomial 365 to avoid aliasing.

In certain non-limiting embodiments, the memory polynomial block 365 can compensate for nonlinear memory effects resulting from thermal variation and bias circuits, for example. The memory polynomial model 365 includes a delay line and polynomial function. The signal is input to the polynomial function which calculates certain terms. Next, the signal passes through the delay line. Outputs are then summed. The total number of taps in the delay line defines the memory depth of the model. The memory polynomial may include even terms and higher order terms (for example, $2^{nd}$ order terms or $7^{th}$ order terms).

Figure 4:
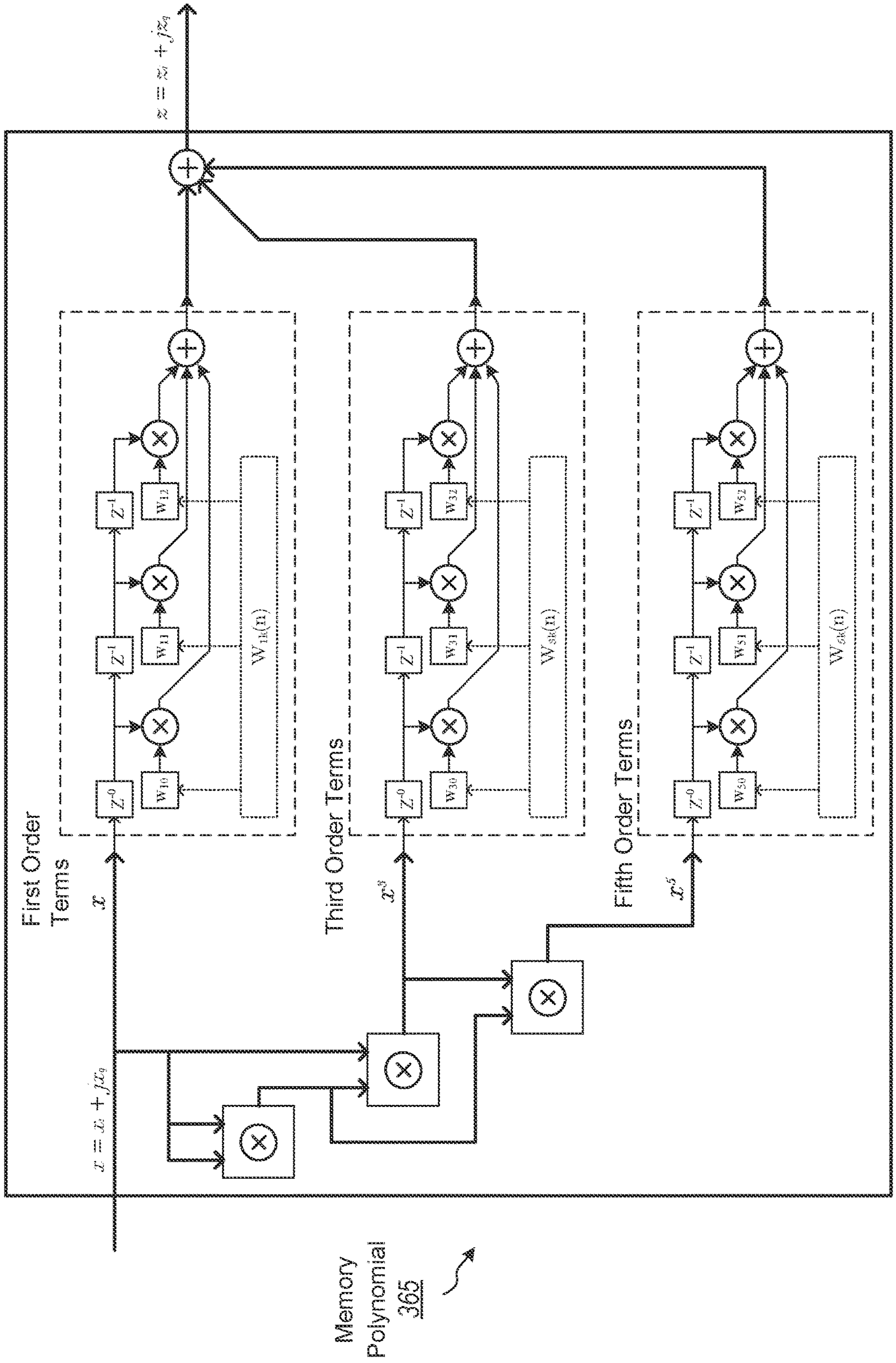
FIG. 4 illustrates a block diagram of memory polynomial, according to one embodiment.

FIG. 4 illustrates an example of a memory polynomial 365. In this example, the memory polynomial includes $1^{st}$, $3^{rd}$, and $5^{th}$ order nonlinear terms. These nonlinear terms expand the signal bandwidth. Because of this bandwidth expansion, interpolation (upsampling) may need to be applied before the memory polynomial to avoid aliasing.

The memory polynomial 365 can invert a channel that has linear distortion followed by nonlinear distortion (i.e., a Wiener system), but it is not able to invert a channel that has linear→nonlinear→linear (i.e., a Wiener-Hammerstein system). The Wiener-Hammerstein system includes linear filters before and after a static nonlinearity. The Wiener-Hammerstein system is a good model/approximation to a power amplifier, such as HPA 130. The two linear filters in a Wiener-Hammerstein system can represent/model the input and output matching networks to the amplifier and linear distortion from other analog/RF components, and the amplifier is represented by the nonlinearity Because the memory polynomial can invert a linear→nonlinear system—but not a linear→nonlinear→linear system—the linear filter 355 is incorporated into the DPD architecture 350, such that the DPD architecture 350 can invert a linear→nonlinear→linear system. That is, the memory polynomial cannot by itself correct for the linear distortion #2 in block 330 of FIG. 3A. However, the DPD architecture 350 in FIG. 3B includes the linear filter 355 before the memory polynomial 365 to cancel out linear distortion #2.

Figure 5:
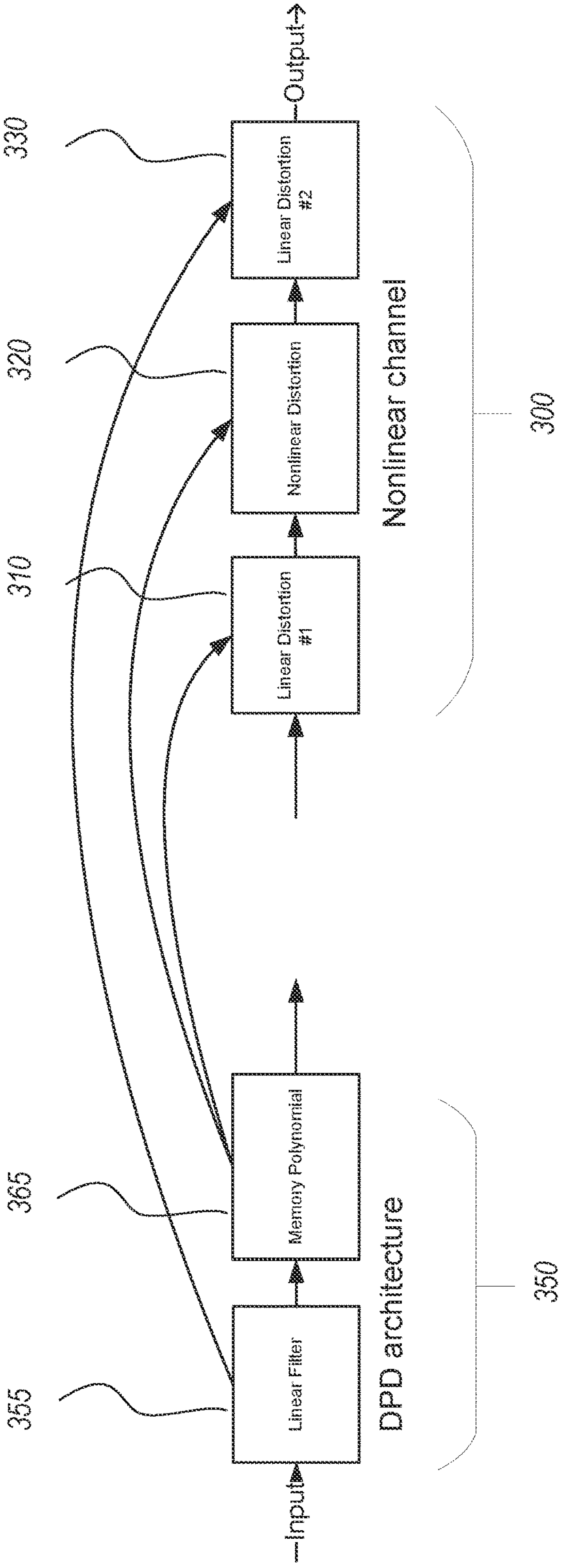
FIG. 5 illustrates a block diagram showing which distortions are corrected by which distortion correction blocks, according to one embodiment.

FIG. 5 combines the nonlinear channel model 300 with the DPD architecture 350, FIG. 5 and shows (using the curved upper arrows) which blocks in the DPD architecture 350 correct which distortions in the nonlinear channel model 300. That is, the DPD linear filter 355 inverts the channel model linear distortion #2 of block 330, and the DPD memory polynomial 365 inverts the channel model linear #1 of block 310 and the nonlinear distortion of block 320.

The DPD architecture 350 can handle nonlinear memory effects. If the HPA 130 does not have significant nonlinear memory effects (i.e., the nonlinearity can be accurately modeled with AM/AM and AM/PM curves), then the memory polynomial 365 can be replaced by a memoryless nonlinearity 365' and a complex linear filter 375, as shown in the modified DPD architecture 350', which is illustrated in FIG. 6.

Figure 6:
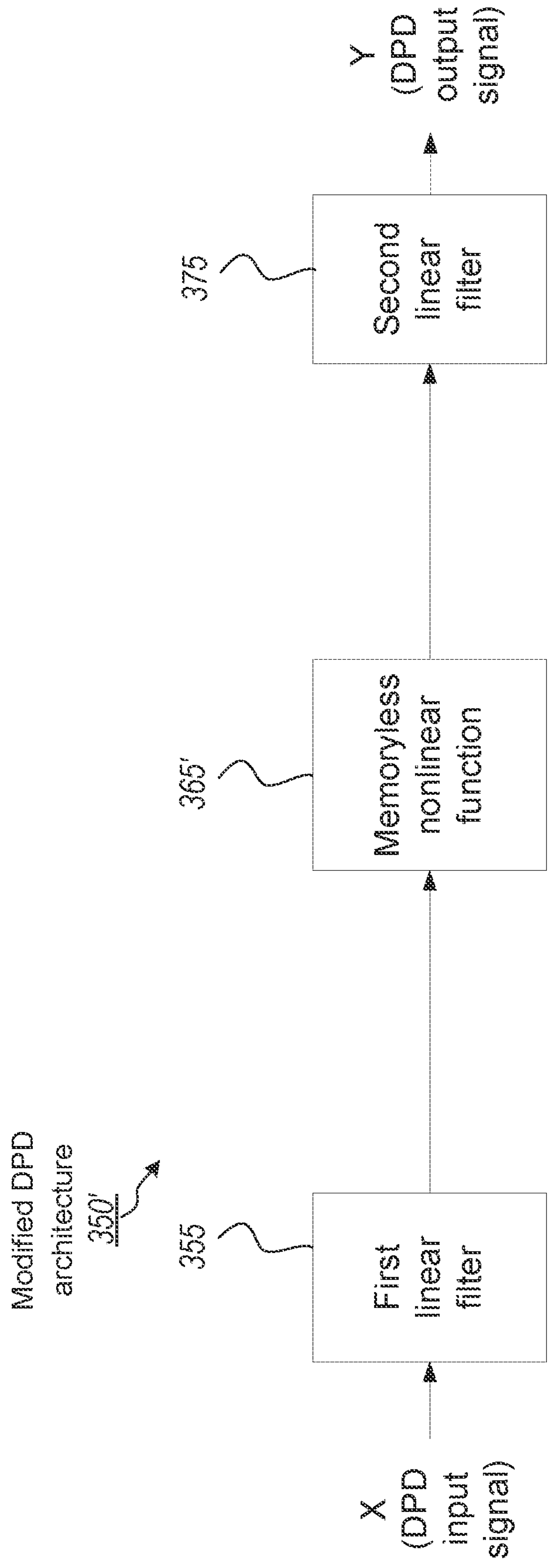
FIG. 6 illustrates a block diagram of a DPD architecture for a channel having nonlinear distortions without memory, according to one embodiment.

FIG. 6 shows a block diagram of a modified DPD architecture 350'. The three main processing blocks are a first linear filter 355, a memoryless nonlinear function 365', and a second linear filter 375. The benefit of the memoryless architecture in the modified DPD architecture 350' is that the memoryless architecture has significantly lower complexity and reduced computational burden relative to the memory polynomial architecture in the DPD architecture 350.

Figure 7A:
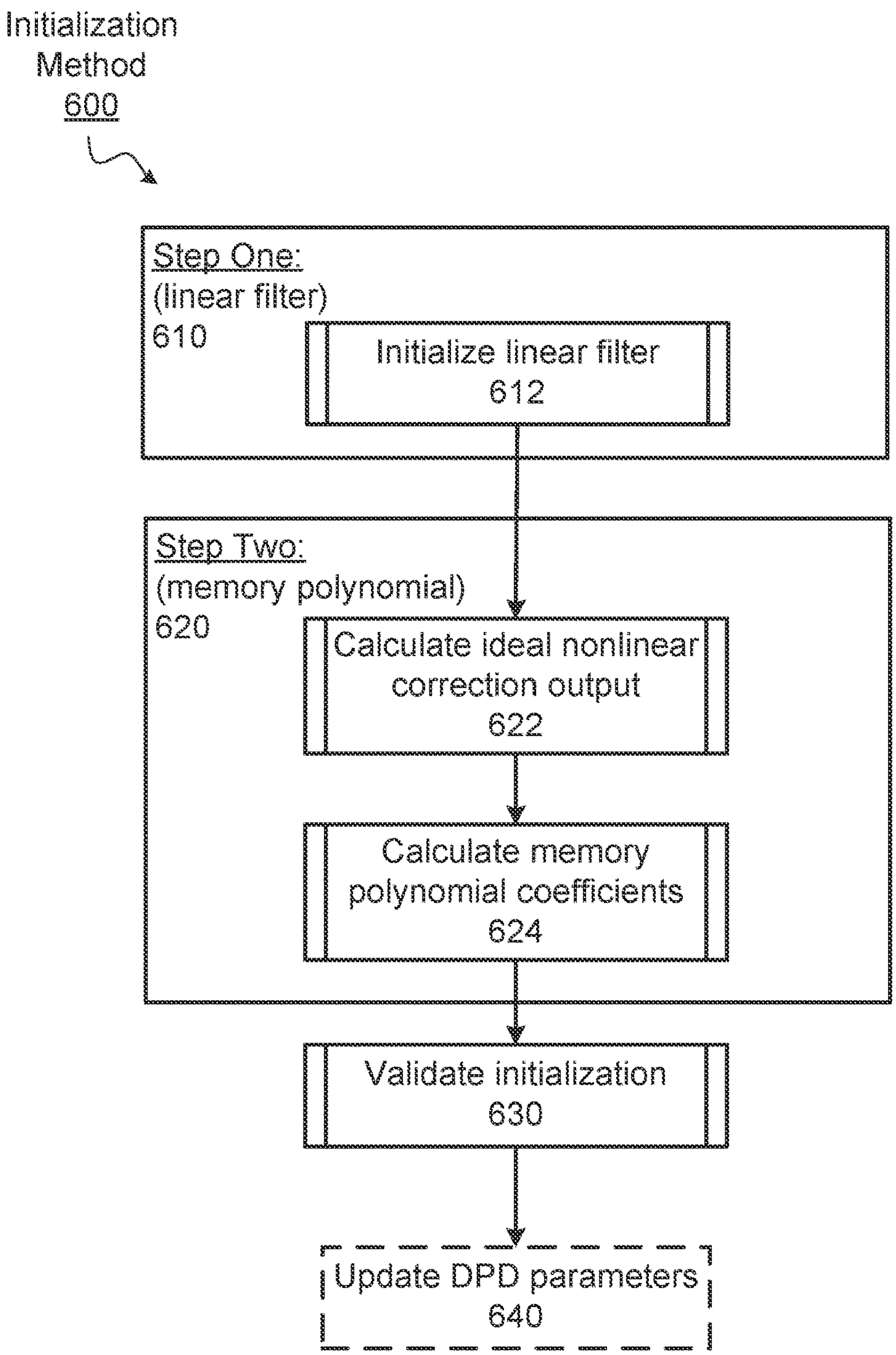
FIG. 7A illustrates a flow diagram of an initialization method, according to one embodiment.

Referring now to FIG. 7A, the initialization method 600 is illustrated as a flow diagram. The initialization method 600 initializes the memory polynomial DPD architecture 350 in FIG. 3B. Additionally or alternatively, the initialization method 600 may also be used to initialize the memoryless DPD architecture 350' in FIG. 6. FIG. 7A shows a flow diagram of a two-step initialization method 600. This two-step method overcomes various challenges, including, e.g., that: (1) the coefficients are not linear-in-parameter; (2) the ideal nonlinear correction output is not known; and (3) the coefficients need to be effective across a wide bandwidth and for many different types of signals including multicarrier signals.

Regarding the first challenge overcome by method 600 (i.e., the coefficients are not linear-in-parameter), the output of the above-discussed DPD architecture 350 depends nonlinearly on the coefficients of the DPD architecture 350, and, therefore, the DPD architecture 350 is not linear in the parameters. Consequently, the least squares (LS) algorithm cannot be used to calculate the coefficients of the DPD architecture 350. However, by splitting the initialization method 600 into two steps, the respective steps separately become linear-in-parameter. As discussed in more detail below, the two-step method 600 overcomes the fact that, as a whole, the DPD architecture is not linear-in-parameter. This is achieved by using step one 610 to determine the coefficients of the linear filter 355. Then, once the linear filter coefficients are known, the problem reduces to solving for the memory polynomial 365 to invert a system of linear distortion #1 and nonlinear distortion without the linear distortion #2, which is linear-in-parameters. Thus, the second step 620, which determines the coefficients of the memory polynomial, may be performed using a least squares (LS) algorithm, as opposed to a more complicated algorithm as would be required if a single step method were used instead of the two-step method discussed herein.

Regarding the second challenge overcome by method 600, calculating DPD coefficients in step two 620 is straightforward once the ideal nonlinear correction output is known, but the ideal nonlinear correction output is not known. Accordingly, before the DPD coefficients are calculated in process 624, the ideal nonlinear correction outputs are determined in process 622. Determining the ideal nonlinear correction output is achieved using an iterative IMD cancelation method, as discussed in more detail below. This method has been shown to be robust, and works for a variety of different signal types, frequencies, and bandwidths.

Regarding the third challenge overcome by method 600, once the DPD architecture 350 has been initialized using the initialization method 600, the DPD architecture 350 is preferably effective for many different signal types over a wide bandwidth. Other methods of initializing are not robust because in other methods the DPD coefficients are typically initialized or adapted for a specific signal. To overcome the limitations of these other initialization methods, in certain non-limiting embodiments, the methods herein use a set of multi-tone sounding waveforms, which are described in more detail below, to more fully characterize the HPA 130, such that the DPD architecture 350 is effectively initialized for different signal types, frequencies, and bandwidths.

In step one 610 of method 600, the coefficients for the linear filter 355 are found using a sounding method, which is described in more detail below. Once the linear filter 355 is known, the system becomes linear-in-parameters, making the memory polynomial coefficients easier to find in step two 620.

In step two 620 of method 600, the memory polynomial coefficients are found. As discussed above, one challenge with DPD initialization is that the ideal nonlinear correction output is not known. To overcome this problem, an IMD cancelation technique is used to determine the ideal nonlinear correction output. Then based on the determined ideal nonlinear correction output, the memory polynomial coefficients can easily be calculated using the least squares algorithm because the system is linear-in-parameter due to the prior determination of the linear filter 355.

In process 630 of method 600, the DPD architecture 350 is validated. Validation of the initialized DPD architecture 350 includes setting the parameters/coefficients of the linear filter 355 and the memory polynomial 365 to the values determined during step one 610 and step two 620. In certain implementations, the DPD architecture 350 is then validated by applying various test waveforms to the DPD architecture 350 and confirming that the output signal from the HPA agrees with the applied test waveforms that were input to the DPD architecture 350.

Optionally, in step 640 method 600, the parameters/coefficients to the DPD architecture 350 may be updated periodically or continuously during real time operation using either an indirect or direct learning method.

Returning to step one 610 of method 600, the coefficients for the linear filter 355 are found using a sounding method based on multi-tone signals. As discussed in M. Weiss, C. Evans and D. Rees, "Identification of nonlinear cascade systems using paired multisine signals," IEEE Trans. Instrum. Meas., vol. 47, pp. 332-336, February 1998 (hereinafter "Weiss"), which is incorporated herein by reference, the linear subsystems of a nonlinear cascade model may be identified by measuring the Volterra kernel of the system using various multi-sine test signals, and thereby generating a system of equations for the linear filter coefficients based on a number of common frequency combinations (e.g., $\omega_1+\omega_2$, $\omega_1-\omega_2$, $2\omega_1$, $2\omega_2$, etc.) resulting from a second-order nonlinearity. The method described herein adapts these insights to determine the coefficients of the linear filter 355 based on odd-order frequency components generated by multi-tone signals interacting via a third-order nonlinearity (or another odd-order nonlinearity).

As discussed above, the third-order nonlinearity (and other odd-order nonlinearities) are important in communications and other applications because the odd-order nonlinearity may produce in-band signals, whereas the even-order frequency components are more likely to be out of band. In step one 610, the linear filter coefficients are determined by inputting multi-tone signals into the HPA 130, and then measuring the levels of the third-order frequency components in the output from the HPA 130 (e.g., the levels of the third-order intermodulation distortion (IMD3)). Using the measured IMD3 levels, a system of linear equations is compiled and then solved to find linear distortion #2 as a function of frequency. The linear filter 355 is the inverse of the linear distortion #2. For example, the inverse of the model the linear distortion #2 may be calculated in the frequency domain, and the result converted to the time domain (e.g., using an inverse fast Fourier transform (IFFT)) to generate the coefficients/taps of the linear filter 355.

For the input to the HPA130, the multi-tone input signal includes two sinusoidal signals, which respectively are given by:

$V_1 \cos(\omega_1 t+\phi_1)$, and $V_2 \cos(\omega_2 t+\phi_2)$, wherein $V_1$ and $V_2$ are the amplitudes of the two sinusoids (and in some embodiments are assumed to be equal), and $\omega_1$ and $\omega_2$ ($\omega_1<\omega_2$) are their frequencies, and, without loss of generality, their respective phases $\phi_1$ and $\phi_2$ are assumed to be zero. As discussed with reference to in FIG. 3A, an HPA 130 together with the upstream and downstream electrical components may be represented as a nonlinear channel model 300 having three cascaded blocks: block 310 representing linear distortion #1; block 320 representing the nonlinear distortion (with memory in certain embodiments and without memory in other embodiments); and block 330 representing linear distortion #2. When the input to the three-block model 300 is a multi-tone signal, i.e., $V_1 \cos(\omega_1 t)+V_2 \cos(\omega_2 t)$, the output will have various nonlinear frequency components. Singling out just the third-order components, the three-block model 300 may be simplified and reduced to the modified three-block model 300' shown in FIG. 8 in which the second block 320' only generates third order terms.

Figure 8:
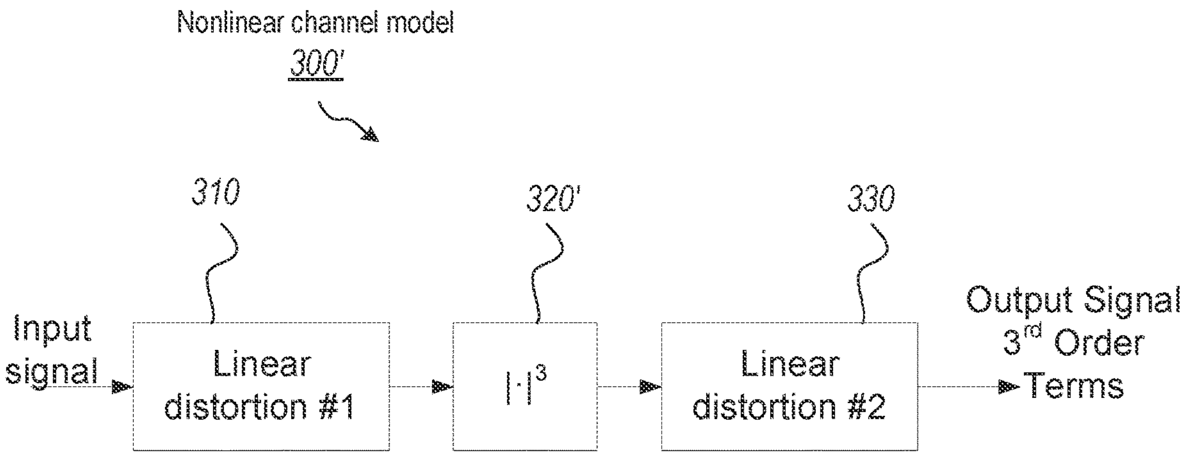
FIG. 8 illustrates a block diagram of a nonlinear channel having a third-order nonlinear distortion, according to one embodiment.

Given the simplified model in FIG. 8, the approach discussed in Weiss can be modified in several ways (e.g., using third-order terms, as opposed to second-order terms) to identify and invert the linear response for the modified three-block model 300' using multi-tone signals. Like the second-order system in Weiss, the modified three-block model 300' is a Wiener-Hammerstein system (linear→nonlinear→linear). The initialization process 612 in step one 610, uses the third-order nonlinear terms (e.g., the IMD3s).

The linear filter initialization process 612 assumes that the contributions to the third-order intermodulation distortion (IMD3) frequency component that arise from higher-order nonlinearities are negligible relative to the third-order contribution. To ensure this assumption is satisfied, the output backoff (OBO) can be increased to reduce the relative strength of these higher-order contributions to the IMD3s. During process 612, the OBO is set high enough so that this assumption is valid. The linear filter initialization process 612 has the advantage of being linear-in-parameter, which contrasts with other methods that attempt to identify simultaneously the coefficients of the nonlinear and linear blocks 310, 320, and 330. Consequently, the linear filter initialization process 612 can be solved using a least squares (LS) method. Further, the linear filter initialization process 612 uses multi-tone signals, which converts the problem of identifying and inverting the linear distortion #2 to the frequency domain. Additionally, the problem of identifying and inverting the linear distortion #2 is separated into two separate LS problems: one LS problem for the phase and another LS problem amplitude. Although, process 612 can identify both the linear distortion #1 and the linear distortion #2, here the focus is on linear distortion #2 because, as shown in FIG. 5, linear distortion #2 is related to linear filter 355 (i.e., linear filter 355 corrects for the linear distortion #2). The significance of correcting the linear distortion #2 is that so doing makes step two 620 linear-in-parameter, as discussed in more detail below.

The linear filter initialization process 612 inputs the multi-tone signals and measures the resultant third-order intermodulation distortion (IMD3) output from the nonlinear channel 300. In certain implementations, the multi-tone signals are generated according to the multi-tone sounding method described below. The measured IMD3 signals include a lower third-order intermodulation distortion (IMDL3), which is at frequency $2\omega_1-\omega_2$, and higher third-order intermodulation distortion (IMDH3), which is at frequency $2\omega_2-\omega_1$. The lower third-order intermodulation distortion (IMDL3) is given by $$a_2^{(2\omega_2-\omega_1)}\left(a_1^{(\omega_1)}V_1\right)^2 a_1^{(\omega_2)}V_2 \cos\left((2\omega_1-\omega_2)t+2\phi_1^{(\omega_1)}-\phi_1^{(\omega_2)}+\phi_2^{(2\omega_2-\omega_1)}\right)\times C_{NL},$$

wherein $C_{NL}$ is the contribution due to the nonlinear distortion block 320. The symbol $$a_i^{(\omega_j)}$$

represents an amplitude change, the subscript i indicates the amplitude change is due to linear distortion #i and the superscript ($\omega_j$) indicates the angular frequency corresponding to the amplitude change. The symbol $$\phi_i^{(\omega_j)}$$

represents a phase change, wherein the subscript i indicates the phase change is due to linear distortion #i, and the superscript ($\omega_j$) indicates the angular frequency corresponding to the phase change. The higher third-order intermodulation distortion (IMDH3) is given by $$a_2^{(2\omega_1-\omega_2)}a_1^{(\omega_1)}V_1\left(a_1^{(\omega_2)}V_2\right)^2 \cos\left((2\omega_2-\omega_1)t+2\phi_1^{(\omega_2)}-\phi_1^{(\omega_1)}+\phi_2^{(2\omega_1-\omega_2)}\right)\times C_{NL}.$$

For each of the above frequency component, separate phase and amplitude equations can be written. Taking the logarithm of the above equations for the IMDL3 and IMDH3 separates the phase equations from the amplitude equations. Additionally, the resultant equations become linear in the respective parameters. That is, the equations can be written as a set of linear equations (e.g., a matrix), such that the coefficients can be solved for using matrix algebra.

For example, the phase equations for the IMDL3 and IMDH3 frequency components are respectively $$\phi_L[\omega_1,\omega_2]=2\phi_1^{(\omega_1)}-\phi_1^{(\omega_2)}+\phi_2^{(2\omega_2-\omega_1)},\text{ and}$$

$$\phi_H[\omega_1,\omega_2]=2\phi_1^{(\omega_2)}-\phi_1^{(\omega_1)}+\phi_2^{(2\omega_1-\omega_2)},$$

wherein $\phi_H[\omega_1, \omega_2]$ and $\omega_L[\omega_1, \omega_2]$ are respectively the measured phases of the IMD3H and IMD3L. The phase equations are converted to matrix form and the matrix equations for all the multi-tone signals in the set are stacked to setup a matrix equation that can be solved (e.g., by using a least-squares (LS) algorithm) to obtain estimates for the respective phases. By carefully choosing the pairs of frequencies for the multi-tone signals, the phase matrix equation can be ensured to not be underdetermined.

The equations for the amplitude in dB of IMD3L and IMD3H are:

$$A_L[\omega_1,\omega_2]=\ln\left|a_2^{(2\omega_2-\omega_1)}\right|+2\ln\left|a_1^{(\omega_1)}\right|+\ln\left|a_1^{(\omega_2)}\right|+c_L,\text{ and}$$

$$A_H[\omega_1,\omega_2]=\ln\left|a_2^{(2\omega_2-\omega_1)}\right|+\ln\left|a_1^{(\omega_1)}\right|+2\ln\left|a_1^{(\omega_2)}\right|+c_H,$$

wherein $A_L[\omega_1, \omega_2]=\ln|IMDL3/C_{NL}|$ and $A_H[\omega_1, \omega_2]=\ln|IMDH3/C_{NL}|$ are derived from the measured amplitudes of the IMD3H and IMD3L, the operation $\ln|\cdot|$ is the logarithm function, and $c_L=2\ln|V_1|+\ln|V_2|$ and $c_H=\ln|V_1|+2\ln|V_2|V_2$ represent known constants derived from the amplitudes of the input sinusoids. These amplitude equations are converted to matrix form and the matrix equations for all the multi-tone signals in the set are stacked to setup a matrix equation that can be solved (e.g., by using an LS algorithm) to obtain estimates for the respective amplitudes. By carefully choosing the pairs of frequencies for the multi-tone signals, the amplitude matrix equation can be ensured to not be underdetermined. For example, the sounding method described below can be used to determine the multi-tone signals.

For the linear distortion #2, solving the matrix equations provides the amplitudes $$a_2^{(\omega_j)}$$

and phase $$\phi_2^{(\omega_j)}$$

distortions at a series of discrete frequencies $\omega_j$. For frequencies other than these discrete frequencies $\omega_j$, the linear distortion #2 amplitudes and phases may be obtained by interpolated or extrapolated (e.g., linear interpolation, quadratic interpolation, cubic interpolation, spline-based interpolation, etc.). In certain embodiments, the inverse of the linear distortion #2 may be calculated in the frequency domain, and then the inverse of the linear distortion #2 may be converted to a time-domain linear filter 355, such as a finite impulse response (FIR) filter. This conversion may be performed by taking a fast Fourier transform (FFT) or discrete-time Fourier transform (DFT) of the frequency-domain inverse of the linear distortion #2. The linear filter 355 is used to correct/reduce the linear distortion #2.

In certain embodiments, the step of determining the phase distortions $$\phi_2^{(\omega_j)}$$

and $$\phi_1^{(\omega_j)}$$

may include unwrapping the phasing using a two-dimensional phase unwrapping algorithm. For example, the two-dimensional phase unwrapping algorithm may be applied before setting up the LS matrixes applying.

Figure 7B:
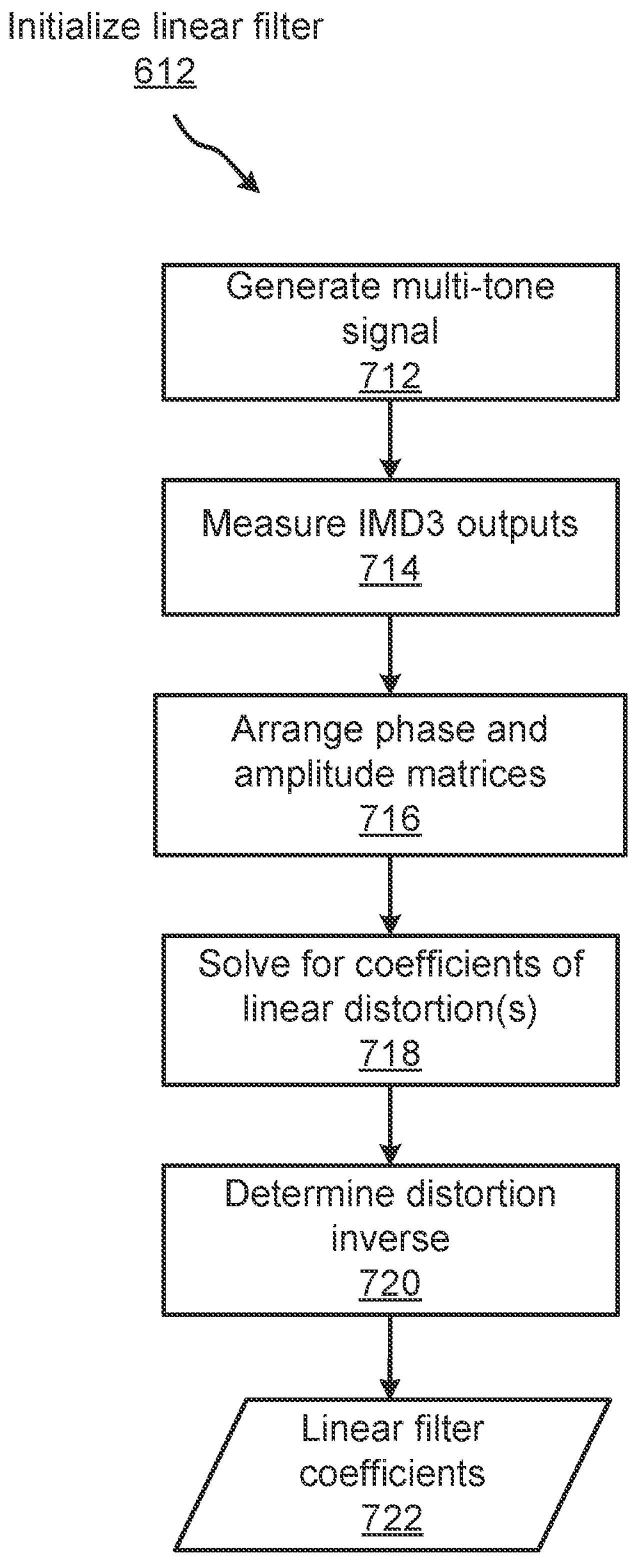
FIG. 7B illustrates a flow diagram of a process for initializing a linear filter, according to one embodiment.

FIG. 7B shows a flow diagram of process 612 to initialize the linear filter 355. In step 712, the multi-tone signal is generated. The initialization process can be performed using multiple multi-tone signals. In step 714, the levels of the IMD3 signal are measured at the output of the nonlinear channel 300. In step 716, the linear equations for the levels of the IMD3 signal are converted to matrix equations. In step 718, the matrix equations are solved to determine the amplitude and phase values of the linear distortion #2 as a function of frequency. In step 720, the inverse of the linear distortions #2 are determined for the time domain, resulting in the coefficient values or taps 722 for the linear filter 355.

Now the multi-tone sounding method is described. The HPA 130 may be sounded using a set of multi-tone signals. For example, the frequencies of the set of multi-tone signals may be selected similar to a frequency selection method described in G. Vandersteen and J. Schoukens, "Measurement and identification of nonlinear systems consisting of linear dynamic blocks and one static nonlinearity," IEEE Transactions on Automatic Control, 44, pp. 1266-1271 (1999) and in M. Schoukens and K. Tiels, "Identification of block-oriented nonlinear systems starting from linear approximations: A survey," Automatica, 85, pp. 272-292 (2017), both of which are incorporated herein by reference in their entirety. For example, a set of multi-tone excitations may be selected to include all multi-tone excitations that are harmonically related at frequencies $k\omega_0$ for $k=1 \ldots 31$, wherein $\omega_0$ is a predefined frequency (e.g., $\omega_0=2\pi625$ kHz). The two spectral components may have predefined amplitudes (e.g., the same amplitude), and may have a uniformly distributed phase relationship in the range $[0, 2\pi]$.

Figure 9:
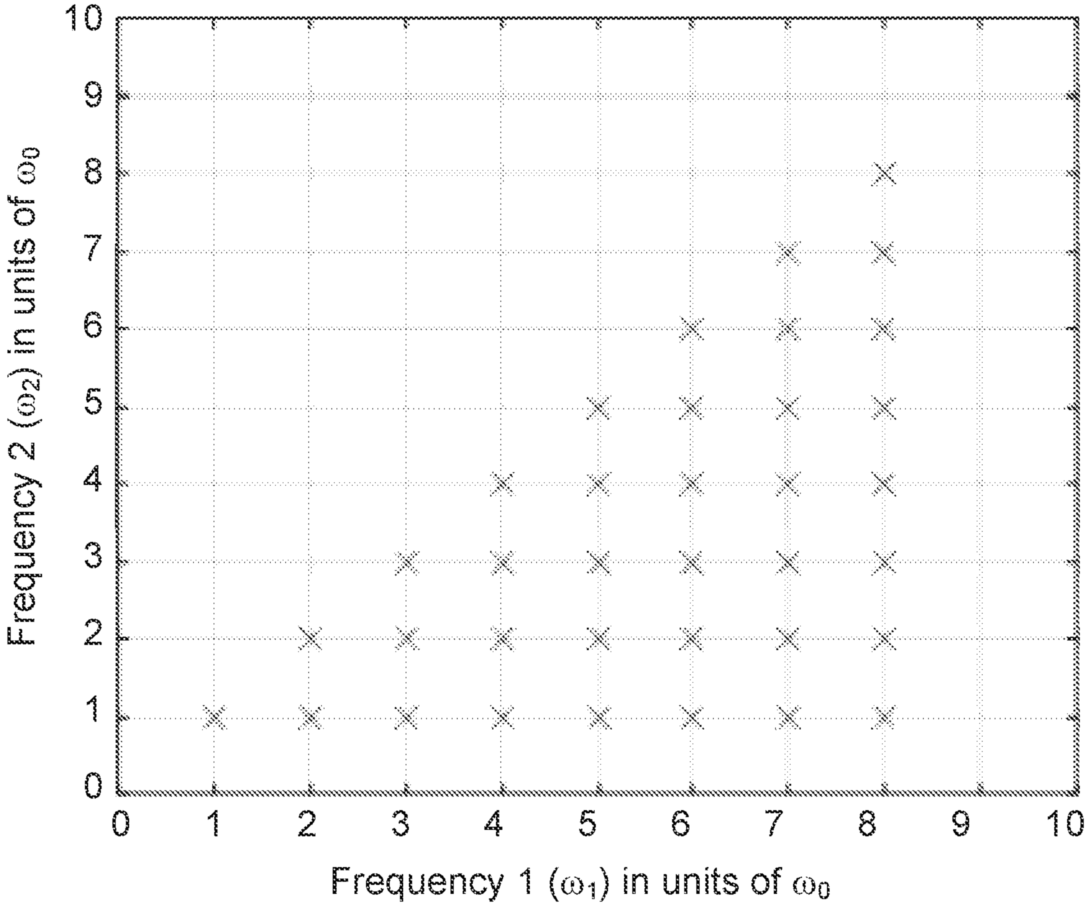
FIG. 9 illustrates a plot of frequency pairs for a set of multi-tone signals, according to one embodiment.

FIG. 9 shows a diagram demonstrating a set of multi-tone signals. In this plot, each 'x' represents a multi-tone signal and the horizontal and vertical axes are respectively the frequencies of each multi-tone signal. In this example, the multi-tone signals span a range of $[\omega_0, 8\omega_0]$. In testing, each pair of multi-tone signals is used as input to the HPA, generating the IMD3 outputs that are used in step one 610. In certain embodiments, a synchronization (sync) signal is used to align the phase among the various signals, as discussed in more detail below with reference to FIG. 10. Experiments performed to generate DPD coefficients calculated using the set of multi-tone signals set shown in FIG. 9 demonstrate good DPD performance for a wide range of different signal types over a wide frequency band.

Figure 10:
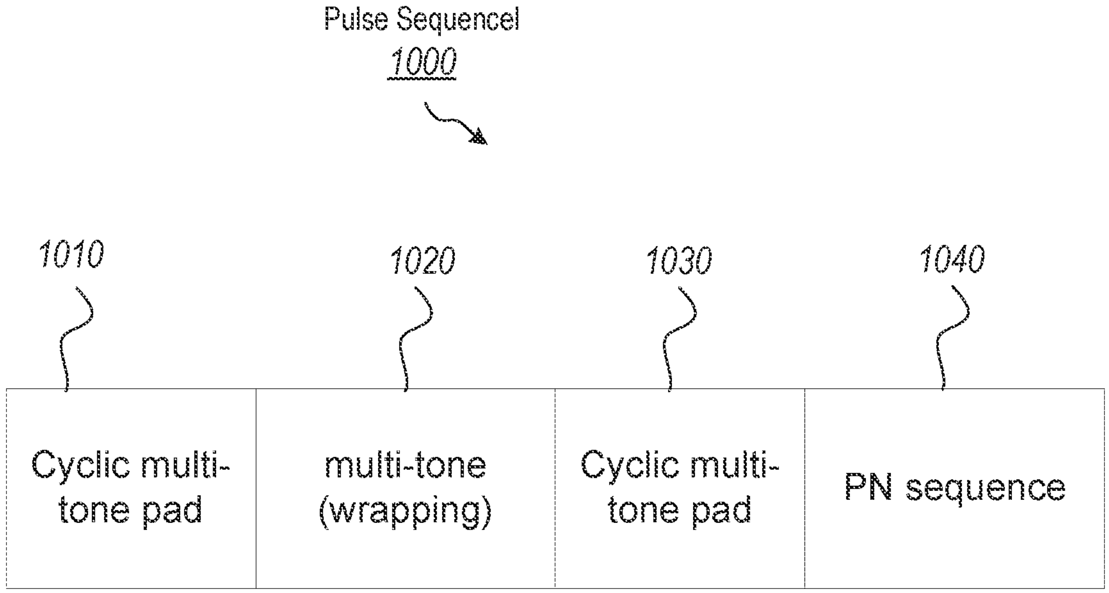
FIG. 10 illustrates a pulse sequence of a multi-tone signal, according to one embodiment.

The phases of the multi-tone signal components after nonlinear distortion (i.e., $\omega_1$, $\omega_2$, IMD3H, IMD3L, etc.) are used for calculating the DPD coefficients. These phases can be measured and synchronized relative to a common reference for all multi-tone signals in the set. In some embodiments, to measure these phases all multi-tone signals in the set are synchronized to a common reference. Measurement and synchronization is accomplished in certain embodiments by embedding a pseudorandom noise (PN) sequence 1040 in the multi-tone signals, and the receive signals are time aligned using the PN sequence 1040. In certain embodiments, the pulse sequence 1000 shown in FIG. 10 is used to synchronize the signals. The PN sequence 1040 of the pulse sequence 1000 may be identical for all multi-tone signals in signal set. Additionally, using a fast Fourier transform (FFT), a multi-tone signal that exactly wraps (the beginning and end of the of the signal are phase continuous) may be used so the signal components amplitude and phase can be measured using an FFT, according to a non-limiting embodiment. Cyclic multi-tone pads 1010 and 1030 are respectively added before and after the wrapping multi-tone signal 1020 to mitigate transients from the PN sequence.

Figure 11:
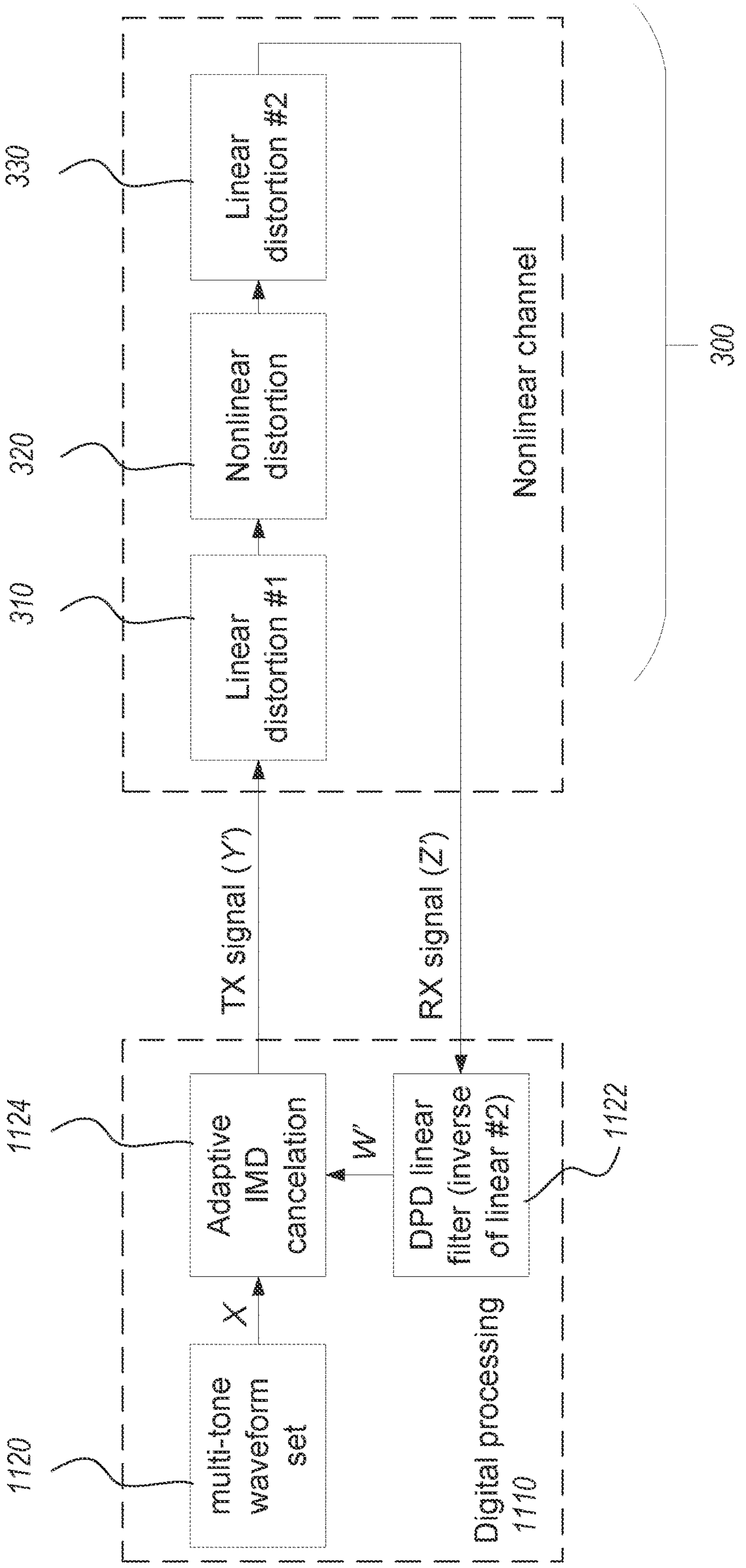
FIG. 11 illustrates a block diagram of an adaptive intermodulation distortion cancelation process to determine ideal nonlinear correction output, according to one embodiment.

FIG. 11 shows a block diagram that illustrates an implementation of process 622 for calculating the ideal nonlinear correction output, which will later be used in process 624 to calculate the coefficients of the memory polynomial 365. In block 1120, a multi-tone waveform from the set of multi-tone waveforms is generated and output to an adaptive IMD cancelation block 1124. The adaptive IMD cancelation 1124 (and the process 622) is performed in the digital domain using various digital processing circuitry 1110, such as in an application specific integrated circuit (ASIC), a special purpose digital signal processor (DSP), a graphics processing unit (GPU), or a central processing unit (CPU). In certain embodiments, the digital domain output from the adaptive IMD cancelation 1122 is converted from a digital signal to analog signal using a digital to analog converter (DAC) circuit, and then the output is mixed with an intermediate frequency signal to convert the analog signal from baseband signal to a carrier wave signal, e.g., a radio frequency (RF) signal, a megahertz (MHz) signal, a gigahertz (GHz) signal, a microwave signal, a millimeter wave signal, etc. The carrier wave signal is the transmitted (TX) signal that passes through the HPA and other electrical components in the transmit path (e.g., the nonlinear channel 300).

As discussed above, step one 610 determines the inverse of linear distortion #2, and the linear distortion #2 is represented by block 330 of the three-block nonlinear channel model 300. In the DPD linear filtering 1122, this inverse of the linear distortion #2 is applied to the output from the nonlinear channel 300 (e.g., the HPA and accompanying circuitry). Having canceled out the linear distortion #2, the adaptive IMD cancelation block in process 624 cancels the linear distortion 310 and the nonlinear distortion 320. An iterative process is used to update the IMD cancelation block 1124 to cancel the IMD for a wide range of signal types, frequencies, and bandwidths. In many cases linear distortion #2 is negligible and can be ignored. In this case step one (610) can be skipped. In this situation the first linear filter (355) and 1122 can be eliminated.

Figure 12A:
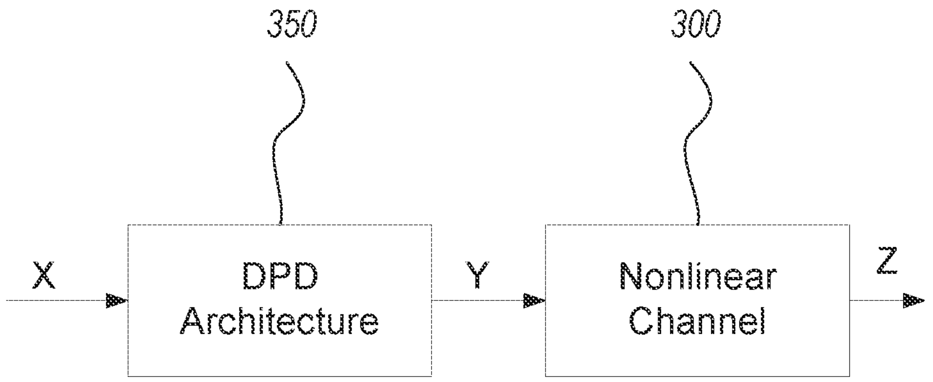
FIG. 12A illustrates a block diagram of using a DPD architecture to pre-compensate for linear and nonlinear channel distortions, according to one embodiment.
Figure 12B:
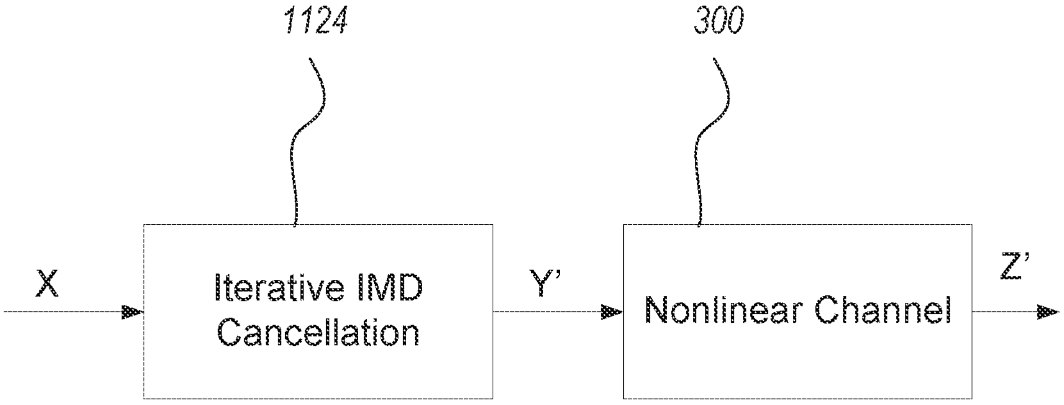
FIG. 12B illustrates a block diagram of using an alternative DPD architecture to pre-compensate for nonlinear channel distortions, according to one embodiment.

FIGS. 12A and 12B illustrate additional details about process 622 for calculating the ideal nonlinear correction output. The nonlinear channel can be represented as various functions $L_1(x)$, $NL(x)$, and $L_2(x)$ corresponding to the respective distortions. Accordingly, the nonlinear channel 300 may be represented as the function $y=L_2(NL(L_1(x)))$. As discussed above, block 1122 functions to approximately invert the linear distortion #2 (i.e., $L_2(x)$) represented by block 330. Accordingly, block 1122 may be represented as the function $\tilde{L}_2^{-1}(x)$, wherein the tilde represents that $\tilde{L}_2^{-1}(x)$ approximates the exact inverse $L_2^{-1}(x)$. Similarly, IMD cancelation block 1124 functions to approximately invert the combination of linear distortion #1 (represented by block 310) together with the nonlinear distortion (represented by block 320). IMD cancelation block 1124 may be represented as the function $L\tilde{N}L^{-1}(x)$, which approximately inverts the function $NL(L_1(x))$. For example, $\tilde{x}=L\tilde{N}L^{-1}(NL(L_1(x)))$ and $\tilde{x}$ is an amplified approximation of the input value x (e.g., $\tilde{x}\approx gx$, wherein g is the gain of the HPA).

FIG. 12A illustrates an embodiment of how the DPD system is used. And FIG. 12B illustrates an embodiment of how the iterative IMD cancellation is performed. In FIG. 12A, the DPD architecture 350 receives the input X and outputs Y, i.e., $Y=L\tilde{N}L^{-1}(\tilde{L}_2^{-1}(X))$. Then the nonlinear channel 300 receives the input Y and outputs Z, i.e., $Z=L_2(NL(L_1(Y)))$. When the DPD architecture 350 is a good approximation of an inverse of the nonlinear channel 300, the output Z is a good approximation of the input X, which has been amplified by the gain g (e.g., $Z\approx gX$). Ideally, the DPD architecture 350 will perfectly invert the nonlinear channel so that $Z=gX$.

Referring now to FIG. 12B, one way of calculating the memory polynomial coefficients is to first determine the output $Y'=L\tilde{N}L^{-1}(X)$ that perfectly inverts the combination of the nonlinear distortion and the linear distortion #1, i.e., $NL(L_1(Y))$. Once the input X and output Y' are known, then these known values are used in process 624 to determine the memory polynomial coefficients (e.g., the memory polynomial performs the function $L\tilde{N}L^{-1}$). Before process 624, an iterative IMD cancellation method is used in process 622 to determine the ideal nonlinear correction output. The IMD cancellation is used to find the ideal DPD output Y'.

In FIG. 12B, the iterative IMD cancelation block 1124 receives the input X and outputs Y', which is an estimate of the ideal nonlinear correction output, i.e., $Y'=L\tilde{N}L^{-1}(X)$. Then the nonlinear channel 300 receives the input Y' and generates the output Z', i.e., $Z'=L_2(NL(L_1(Y')))$. Because this process does not include the inverse to linear distortion #2 (i.e., $\tilde{L}_2^{-1}(x)$), the output Z' approximates the input X with the linear distortion #2, i.e., $Z'\approx L_2(NL(L_1(Y)))=L_2(X)$. Accordingly, in FIG. 11 the RX signal first passes through the DPD linear filter block 1122 before being used by the adaptive IMD cancellation block 1124. That is, the RX signal in FIG. 11 (i.e., Z') is received by the DPD linear filter block 1122, which was derived previously in step one 610, to generate an output $W'=\tilde{L}_2^{-1}(Z')$. An iterative process, such as a multidimensional search, is performed to determine the ideal nonlinear correction output that minimizes IMD terms in the signal W'.

FIG. 11 illustrates a non-limiting embodiment of the process 622 for calculating the ideal nonlinear correction output. In this process, a known multi-tone signal passes through and is modified by digital processing circuitry that performs an adaptive IMD cancelation process to generate a transmit (TX) signal. The TX signal is then transmitted through the nonlinear channel 300, which is modeled as linear distortion #1 block 310, nonlinear distortion block 320, and linear distortion #2 block 330. Then the output of the channel (e.g., the RX signal) is measured, after which the linear distortion #2 is canceled/mitigated using digital processing circuitry 1112, which performs the DPD linear filter processing that is the inverse of the linear distortion #2. The DPD linear filter performed by the digital processing circuitry 1112 is essentially (if not exactly) the same as the first linear filter 355, which performs the processing that is the inverse of the linear distortion #2 previously obtained in step one 610. The resultant signal W' from the DPD linear filter 1122 is then captured, and the IMD levels are derived from the captured signal W'. Next, the estimate of the ideal nonlinear correction output Y' is updated to reduce the IMD levels. Essentially, process 622 performs an iterative process of searching for the ideal nonlinear correction output Y' that cancels the IMD components in W'. Thus, process 622 is a learning process to generate anti-IMD signals that cancel the IMD signals in the nonlinear channel.

Process 622 may be an iterative process and continues until the IMD levels (or error signal derived from the IMD levels) is minimized. For example, in certain embodiments a set of stopping criteria are set for process 622. These stopping criteria can include a predefined IMD threshold (or error signal threshold). If the measured IMD levels fall below the predetermined threshold for a given number of iterations, then process 622 is complete and method 600 continues to process 624. These stopping criteria can also include a stopping criterion based on a maximum number of iterations. For example, if the maximum number of iterations is exceeded, then process 622 is complete and method 600 continues to process 624. These stopping criteria can include additional criteria.

Any one or more of various adaption methods may be used to perform the iterative IMD cancelation in process 622. For example, in certain embodiments, the adaption method can be a convex optimization method (e.g., a gradient descent method, Lagrange multiplier method, a LS method, etc.), a genetic algorithm, a simulated annealing method, a brute force method, or some other optimization method. Alternatively or additionally, a brute force method may be used to perform the iterative IMD cancelation in process 622. Further, a first search method (e.g., a fast-converging search method) may be used initially, and then a second search method (e.g., a high-precision search method) may be used in the end to find the ideal nonlinear correction output that will be passed on to process 624.

For the optimization adaption, the error signal to be minimized may include a combination (e.g., a weighted sum) of several IMD components. For example, the error signal may be a weighted sum of the levels of the measured IMD components of the captured signal W'. The quantity of IMD components used in the error signal may be maintained at a manageable number of IMD components because multi-tone signals are used, as opposed to signals having more frequencies resulting in more combinations of frequencies (i.e., more IMD components). The list below gives a few notes about the IMD cancelation algorithm:

As discussed above, process 622 may be viewed as creating anti-IMDs that cancel the IMDs generated in the nonlinear channel 300. Further, process 622 functions to equalize the fundamental frequencies $\omega_1$ and $\omega_2$ such that the fundamental frequencies have a desired amplitude and no phase shift (or at least a uniform/consistent phase shift) at the output of the nonlinear channel 300.

Figure 7C:
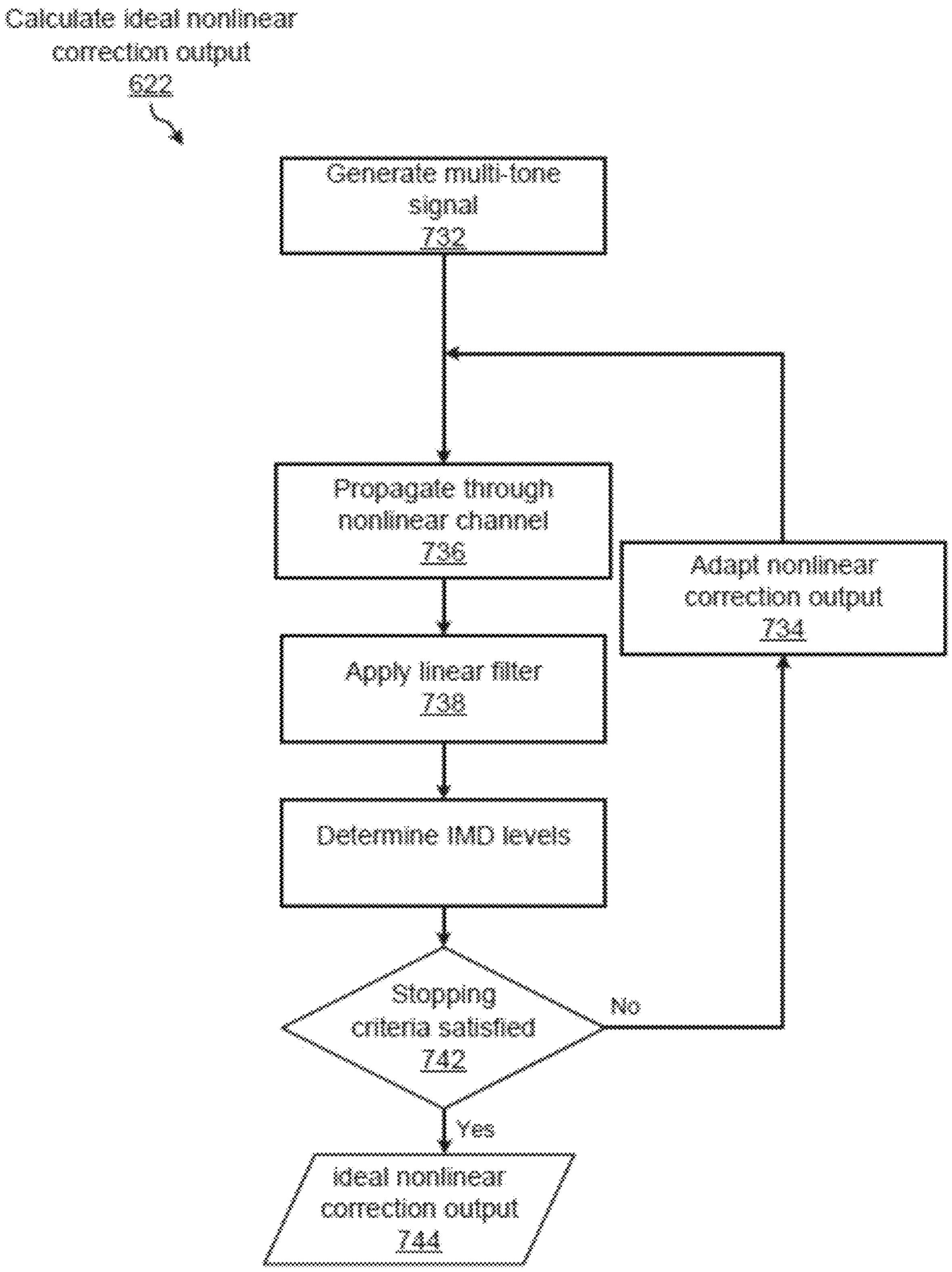
FIG. 7C illustrates a flow diagram of a process for calculating an ideal nonlinear correction output, according to one embodiment.

FIG. 7C shows a flow diagram of process 622 to calculate ideal nonlinear correction output. In step 732, the multi-tone signals X are generated and are input to adaptive IMD cancelation block 1124. Given the multi-tone signals X and in the feedback W' from the DPD linear filter block 1122, in step 736, the adaptive IMD cancelation block 1124 predicts/guesses a signal Y' for the ideal nonlinear correction output, which is output from the IMD cancelation block 1124. In step 736, the output Y' from the adaptive IMD cancelation block 1124 propagates through the nonlinear channel 300, generating thereby the signal Z'. In step 738, the DPD linear filter block 1122 applies the linear filter 355 to the signal Z', generating thereby the signal W'. In step 742, the IMD cancelation block 1124 determines IMD levels or determines an error signal based on the IMD levels. In step 744, the determined IMD levels or error signal based on the IMD levels are compared to stopping criteria. When the stopping criteria are not satisfied, the process 622 continues at step 734 by guessing a new signal Y' for the ideal nonlinear correction output. When the stopping criteria are satisfied, the process 622 stops and outputs the signal Y' for the ideal nonlinear correction output.

Referring now to process 624, the memory polynomial initialization is linear-in-parameters (e.g., the equations are linear with respect to the memory polynomial coefficients that are being estimated) because the DPD linear filter 1122 has been corrected for the linear distortion #2. Consequently, in process 624, the memory polynomial coefficients can be calculated using an LS algorithm where the ideal multi-tone signal X is the input and the IMD cancelation algorithm output Y' is the ideal nonlinear correction output that was determined in process 622. The memory polynomial coefficients are then estimated based on the input X and outputs Y'. In certain nonlimiting embodiments, the memory polynomial coefficients are the weighting coefficients in FIG. 4 for the first-order term (i.e., $w_{10}$, $w_{11}$, $w_{12}$), third-order term (i.e., $w_{30}$, $w_{31}$, $w_{32}$), and fifth-order term (i.e., $w_{50}$, $w_{51}$, $w_{52}$). In process 624, the memory polynomial coefficients are determined such that they generate the output Y' in response to the input X. In FIG. 4, the input to the memory polynomial 365 is illustrated as "x" and the output is illustrated as "≈".

It is understood that the disclosed method may be used with different architectures used for the memory polynomial 365, and that different architectures may have different numbers of order terms and different numbers of weighting coefficients. It is understood that the disclosed method may find/calculate the memory polynomial coefficients using other methods than the LS method discussed above. Note that in some embodiments, a different DPD algorithm may be used, such as a generalized memory polynomial.

Figure 7D:
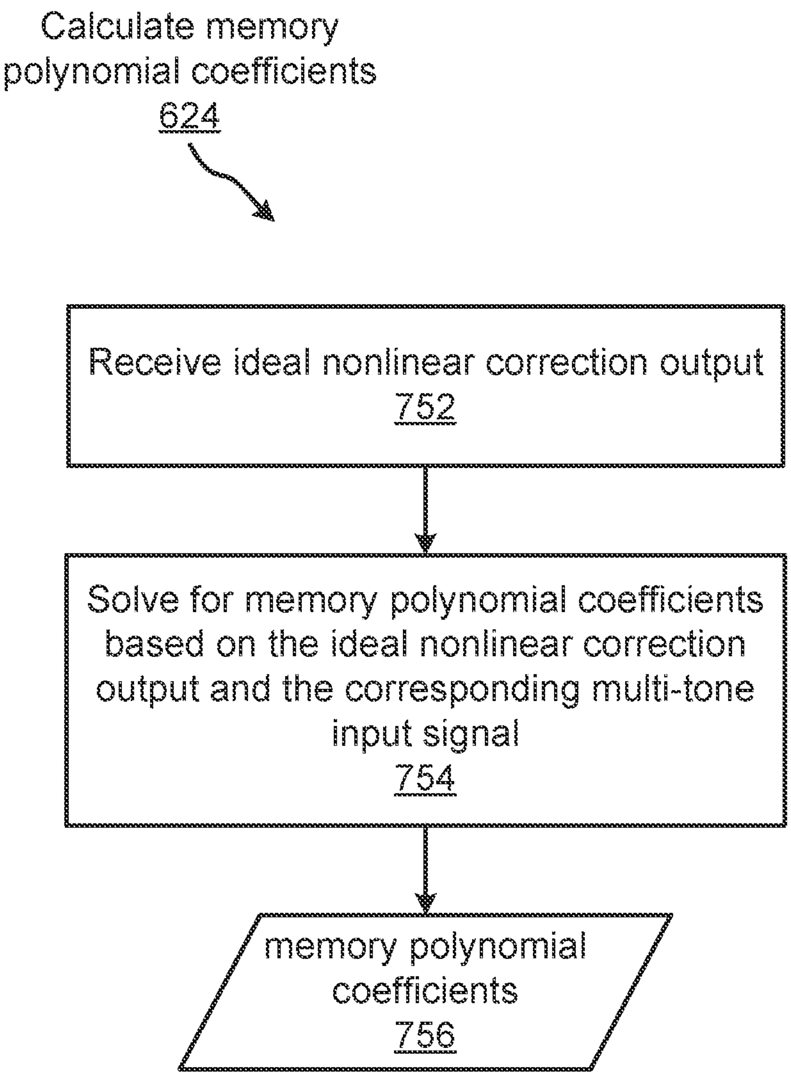
FIG. 7D illustrates a flow diagram of a process for calculating coefficients of a memory polynomial, according to one embodiment.

FIG. 7D shows a flow diagram of process 624 to calculate the coefficients of the memory polynomial. In step 752, the signal Y' representing the ideal nonlinear correction output is received from process 622. In step 754, the memory polynomial coefficients are solved for based on the ideal nonlinear correction output Y' and the corresponding multi-tone input signal X, resulting in the coefficients 756 of the memory polynomial 365.

To validate the DPD architecture 350, the accuracy of this initialized DPD architecture 350 may be quantified by applying input X to the DPD architecture 350 and confirming that the expected output is generated from the DPD architecture 350. Additionally or alternatively, the DPD architecture 350 may be validated by applying input X to a combination of the DPD architecture 350 and the nonlinear channel 300, and then confirming that the expected output is generated. The respective parts/blocks of the DPD architecture 350 may be validated separately. For example, the memory polynomial 365 may be validated by applying input X to the memory polynomial 365 and confirming that the expected output Y' is generated by the memory polynomial 365. The validation process 630 may also be performed using signals multi-tone that are different from the two tone signal set used to perform the two-step initialization. These signals would be representative of operational signals used in the systems. The DPD performance would be quantified by applying input a representative input signals to the DPD architecture 350 and confirming that the expected outputs are generated from the DPD architecture 350.

Figure 13:
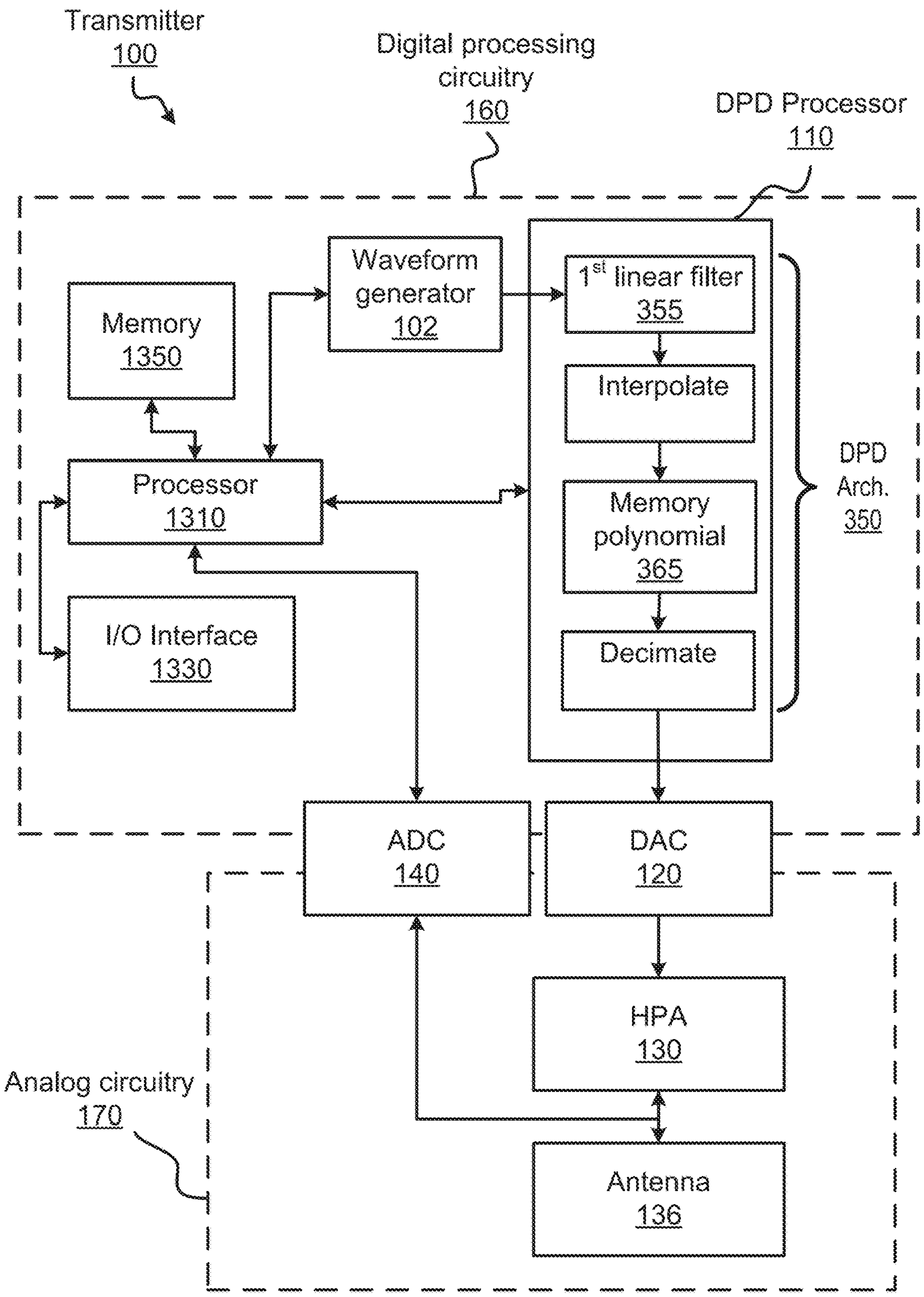
FIG. 13 illustrates another block diagram of a transmitter, according to one embodiment.

FIG. 13 illustrates a block diagram of the transmitter 100. The processor 1310 can be any programmable microcontroller, microprocessor, microcomputer or chips that can be configured by software instructions (applications) to perform a variety of functions, including functions of various embodiments described herein. The processor 1310 may be field programable gate array (FPGA), an application specific integrated circuit (ASIC), or other circuitry configured to perform instructions on sets of data and store results.

Software applications performing some embodiments described herein (e.g., method 600) can be stored in the memory 1350 before they are accessed and loaded into the processor 1310. The processor 1310 can include onboard memory and/or have access to the memory 1350 sufficient to store the software instructions. The memory 1350 can also include an operating system (OS). The memory 1350 may include FLASH memory, RAM, ROM, PROM, EPROM, EEPROM, magnetic storage drive, or any type of non-transitory computer readable medium.

Additionally, the memory 1350 can be a volatile or nonvolatile memory, such as flash memory, or a mixture of both. For the purposes of this description, a general reference to memory refers to all memory accessible by the processor 1310, including memory 1350, removable memory plugged into the transmitter 100, and memory within the processor 1310 itself, including a secure memory.

The transmitter 100 can also include an input/output (I/O) interface 1330 to receive and transmit signal to peripheral devices and sensors, or to communicate with an external controller. For example, the I/O interface 1330 may include a high-speed parallel interface. Additionally or alternatively, the I/O interface 1330 may include a serial interface. The I/O interface 1330 may include an I/O bus and a physical port, such as a universal serial bus (USB) port, or small computer system interface (SCSI) port, or other physical digital communicans port.

As discussed in reference to FIG. 1, the transmitter 100 includes, within the digital processing circuitry 160, a waveform generator 102 that transmits a digital waveform to the DPD processor 110. Both the waveform generator 102 and the DPD processor 110 can be controlled by the processor 1310. For example, the processor 1310 can control the waveform generator 102 to generate the various multi-tone signals used in the two-step initialization method 600, and the processor 1310 can control the DPD processor 110 to set the values of the linear filter 355 and the coefficients of the memory polynomial 365. In FIG. 13, the DPD processor 110 is illustrated as having the DPD architecture 350, but other configurations for the DPD processor 110 are contemplated, including, e.g., the modified DPD architecture 350'.

The signal converted to an analog signal by a digital-to-analog converter (DAC) 120. The resultant analog signal is then amplified by the HPA 130, after which a portion of the output from the HPA 130 is converted back to digital via an analog-to-digital converter (ADC) 140. The resultant digital signal is fed to processor 1310 that performs a DPD coefficient initialization method 600 to initialize the coefficients used in DPD processor 110. The DPD processor 110 compensates for nonlinear and linear distortion resulting from the HPA 130 and other circuitry in the transmission path to the antenna 136.

In the examples above it should be noted that although not shown various alternatives can be implemented.

The discussion above refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of digital predistortion initialization, the method comprising:

receiving an original propagated electrical signal resulting from an original multi-tone electrical signal input into a nonlinear channel;

determining a modified input electrical signal that pre-compensates for the nonlinear channel, such that transmitting the modified input electrical signal through the nonlinear channel results in a modified output electrical signal having reduced distortions relative to the nonlinear distortions in the original propagated electrical signal;

using the original multi-tone electrical signal and the modified output electrical signal to determine nonlinear filter coefficients for a nonlinear filter that reduces nonlinear distortions in an output electrical signal from the nonlinear channel when the nonlinear filter is applied to an input electrical signal, input into the nonlinear channel, to perform predistortion prior to the transmission of the input electrical signal through the nonlinear channel;

wherein determining nonlinear coefficients for the nonlinear filter is based on the modified output electrical signal and the original multi-tone electrical signal having multiple simultaneous tones; and wherein the modified input electrical signal is determined using an iterative process that adapts the modified input electrical signal to reduce levels of intermodulation distortions in the modified output electrical signal, wherein the intermodulation distortions are based on the multiple simultaneous tones, wherein the iterative process comprises, for at least one intermodulation distortion component:

estimating phase and amplitude of the at least one intermodulation distortion component in the modified output electrical signal; and determining the nonlinear coefficients based on the estimated phase and amplitude of the at least one intermodulation distortion component.

2. The method of claim 1, wherein the nonlinear channel has a nonlinear distortion portion, followed in sequence by a second linear distortion portion, an output electrical signal having second linear distortions, below a predetermined threshold, due to the second linear distortion portion, after processing by the nonlinear channel.

3. The method according to claim 2, wherein the second linear distortion portion inherently results in the original propagated electrical signal having the second linear distortions below the predetermined threshold.

4. The method according to claim 2, further comprising predistorting the original propagated electrical signal into the nonlinear channel, based on the second linear distortion portion to cause the original propagated electrical signal to be a first corrected signal having the second linear distortions below the predetermined threshold.

5. The method according to claim 4, further comprising:

determining coefficients for a second linear filter that performs the predistorting of the original propagated electrical signal which reduces the second linear distortions in the output electrical signal; and applying the second linear filter to the modified input electrical signal.

6. The method according to claim 5, wherein applying the second linear filter to the input signal causes coefficients of the nonlinear filter to be linear-in-parameter, and the determining coefficients of the second linear filter is performed by solving for the coefficients of the second filter using a least-squares method.

7. The method according to claim 5, further comprising:

initializing the second linear filter by selecting as the original propagated electrical signal, respective multi-tone signals from a set of multi-tone signals, each multi-tone signal having a respective set of frequencies from a plurality of discrete frequencies, and the plurality of discrete frequencies being selected to span a predefined frequency range, determining amplitude linear equations based on measured intermodulation distortion components of the output electrical signal, when the nonlinear channel is excited by the respective multi-tone signals from the set of multi-tone signals, determining phase linear equations based on the measured intermodulation distortion components of the output electrical signal, when the nonlinear channel is excited by the respective multi-tone signals from the set of multi-tone signals, and determining the second linear filter coefficients based on the amplitude linear equations and the phase linear equations.

8. The method according to claim 1, wherein the nonlinear filter is linear-in-parameter, and determining coefficients of the nonlinear filter is performed by solving for the coefficients of the nonlinear filter using a least-squares method using the original input multi-tone electrical signal and the modified output electrical signal.

9. The method according to claim 1, wherein the nonlinear channel has a first linear distortion portion preceding a nonlinear distortion portion, and determining nonlinear filter coefficients of the nonlinear filter further comprises selecting coefficients of the nonlinear filter that reduce distortions caused by the first linear distortion portion in addition to reducing the nonlinear distortions.

10. The method according to claim 1, wherein determining the coefficients for the nonlinear filter further includes determining the nonlinear filter coefficients to reduce nonlinear distortions that arise, at least in part, from a power amplifier in the nonlinear channel, such that the nonlinear distortions, which are reduced by the nonlinear filter, include compression and/or saturation of the power amplifier.

11. The method according to claim 5, further comprising:

initializing the second linear filter and the nonlinear filter by generating an input electrical signal to be a set of multi-tone electrical signals comprising a portion having a first frequency component and a second frequency component;

transmitting the input electrical signal through the nonlinear channel to generate the original propagated electrical signal, the original propagated electrical signal including one or more intermodulation distortion components of the first frequency component and the second frequency component that are generated by transmitting the multi-tone electrical signal through the nonlinear channel;

wherein determining coefficients for the nonlinear filter and the second linear filter is performed using a synchronization that time synchronizes the set of multi-tone electrical signals.

12. The method according to claim 1, wherein determining the nonlinear coefficients for the nonlinear filter includes that the nonlinear channel has a memory, the nonlinear filter comprises a memory polynomial, and determining the nonlinear coefficients for the nonlinear filter includes setting coefficients of the memory polynomial to values that reduce the nonlinear distortions with the memory, and the values of the coefficients of the memory polynomial being determined using a system of linear equations that relates the coefficients of the memory polynomial, the input electrical signal, and a modified input electrical signal, wherein the modified input electrical signal is an electrical signal that, when input to the nonlinear channel, reduces the nonlinear distortions and/or intermodulation distortion components in the output electrical signal from the nonlinear channel.

13. The method according to claim 1, wherein determining the nonlinear coefficients for the nonlinear filter includes that the nonlinear filter comprises a memoryless nonlinear filter and another linear filter, and determining the nonlinear coefficients for the nonlinear filter includes setting coefficients of the memoryless nonlinear filter and the another linear filter to values that reduce the nonlinear distortions.

14. A method of reducing distortion in an electrical signal for wireless transmission, the method comprising:

generating a multi-tone electrical signal comprising a first portion and a second portion, the first portion having at least a first frequency component and a second frequency component, and the second portion having a synchronization signal;

transmitting the multi-tone electrical signal through a nonlinear channel to generate an output electrical signal at an output of the nonlinear channel, the nonlinear channel causing linear distortions and nonlinear distortions in the output electrical signal;

detecting, in the output electrical signal, intermodulation distortion components, the first frequency component, and the second frequency component;

using the synchronization signal to measure, in the output electrical signal, phases of the intermodulation distortion components, the first frequency component, and the second frequency component; and determining coefficients of a digital predistortion processor based on the intermodulation distortion components, the first frequency component, the second frequency component, and the phases of the intermodulation distortion components, the first frequency component, and the second frequency component, wherein the digital predistortion processor reduces the intermodulation distortion components in the output electrical signal, wherein the intermodulation distortions are based on the first frequency component and the second frequency component.

15. The method according to claim 14, wherein the synchronization signal comprises a pseudo-random noise sequence, and the measuring of the phases in the output electrical signal includes using the synchronization signal to time align the intermodulation distortion components, the first frequency component, and the second frequency component.

16. The method according to claim 14, wherein the generating of the multi-tone electrical signal is repeated using respective frequency pairs for the first frequency component and the second frequency component, the respective frequency pairs having different center frequencies and having different frequency spacings between the first frequency component and the second frequency component.

17. The method according to claim 14, wherein the generating of the multi-tone electrical signal is repeated using respective frequency pairs for the first frequency component and the second frequency component, the respective frequency pairs having frequencies that are spaced apart by integer multiples of a predefined frequency period wo.

18. The method according to claim 14, wherein the generating of the multi-tone electrical signal is repeated using respective frequency pairs for the first frequency component and the second frequency component, wherein frequencies of the respective frequency pairs span a predefined frequency range, and bandwidths of the respective frequency pairs span another predefined frequency range.

19. A transmitter, comprising:

a waveform generator configured to generate an input electrical signal;

a digital predistortion processor configured to receive the input electrical signal and apply thereto a nonlinear filter;

a digital to analog converter configured to convert an output of the digital predistortion processor to an analog signal;

a nonlinear channel comprising an amplifier that is configured to amplify the analog signal, the nonlinear channel causing nonlinear distortions and linear distortions to the analog signal;

an analog to digital converter configured to convert a part of the analog signal to an output electrical signal; and processing circuitry configured to initialize values of coefficients of the nonlinear filter of the digital predistortion processor to pre-compensate for and thereby reduce the nonlinear distortions to the analog signal, the processing circuitry being configured to initialize the values of the coefficients of the first filter and the second filter by:

receiving an original propagated electrical signal resulting from a multi-tone electrical signal input into the nonlinear channel, the original propagated electrical signal having second linear distortions, below a predetermined threshold, after processing by the nonlinear channel, the original propagated electrical signal further having nonlinear distortions caused by the nonlinear channel, determining a modified input electrical signal that pre-compensates for the nonlinear distortions, such that transmitting the modified input electrical signal through the nonlinear channel results in a modified output electrical signal having reduced nonlinear distortions relative to the nonlinear distortions in the original propagated electrical signal, using the original input electrical signal and the modified input-output electrical signal to determine nonlinear filter coefficients for the nonlinear filter, that reduces nonlinear distortions in an output electrical signal from the nonlinear channel when the nonlinear filter is applied to an input electrical signal, input into the nonlinear channel, to perform predistortion prior to the transmission of the input electrical signal through the nonlinear channel, wherein determining nonlinear coefficients for the nonlinear filter is based on the modified output electrical signal and the original propagated electrical signal having multiple simultaneous tones; and wherein the modified input electrical signal is determined using an iterative process that adapts the modified input electrical signal to reduce levels of intermodulation distortions in the modified output electrical signal, wherein the intermodulation distortions are based on the multiple simultaneous tones, wherein the iterative process comprises, for at least one intermodulation distortion component:

estimating phase and amplitude of the at least one intermodulation distortion component in the modified output electrical signal; and determining the nonlinear coefficients based on the estimated phase and amplitude of the at least one intermodulation distortion component.

20. The transmitter of claim 19, wherein the processing circuitry is further configured to:

predistort an input signal input into the nonlinear channel, based on the linear distortions to cause the original propagated electrical signal to be a first corrected signal having the second linear distortions, below the predetermined threshold.

* * * * *